US 6,631,092 B2

(12) United States Patent
Yamasaki

(10) Patent No.: US 6,631,092 B2
(45) Date of Patent: Oct. 7, 2003

(54) SEMICONDUCTOR MEMORY DEVICE CAPABLE OF IMPOSING LARGE STRESS ON TRANSISTOR

(75) Inventor: Kyoji Yamasaki, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/135,511

(22) Filed: May 1, 2002

(65) Prior Publication Data
US 2003/0063509 A1 Apr. 3, 2003

(30) Foreign Application Priority Data
Sep. 28, 2001 (JP) ......................... 2001-299580

(51) Int. Cl.⁷ ................................. G11C 7/00
(52) U.S. Cl. .............. 365/201; 365/189.09; 365/230.06
(58) Field of Search ........................... 365/201, 189.09, 365/189.11, 230.06, 149

(56) References Cited
U.S. PATENT DOCUMENTS 5,590,079 A * 12/1996 Lee et al. .................... 365/201
6,205,067 B1 * 3/2001 Tsukude ...................... 365/201
6,317,366 B1 * 11/2001 Okamura et al. ......... 365/189.08
6,333,517 B1 * 12/2001 Tamaki ........................ 257/48
6,414,890 B2 * 7/2002 Arimoto et al. ............. 365/201

FOREIGN PATENT DOCUMENTS

| JP | 7-93995 | 4/1995 |
| JP | 10-125096 | 5/1998 |
| JP | 11-154400 | 6/1999 |
| JP | 2000-1888000 | 7/2000 |

* cited by examiner

Primary Examiner—Anh Phung
(74) Attorney, Agent, or Firm—McDermott, Will & Emery

(57) ABSTRACT

The DRAM includes a power supply switching circuit which provides a word line select circuit with a power supply potential when a test signal is activated. The potential of a main word line becomes an H level equal to the power supply potential when a word line is not selected. Thus, when a sub-decode signal attains an H level equal to a boosted potential, not only an N channel MOS transistor but also a P channel MOS transistor turn on in a word line driver, and a leakage current running through the word line driver comes to flow. Accordingly, large stress is imposed on the P channel MOS transistor.

3 Claims, 22 Drawing Sheets

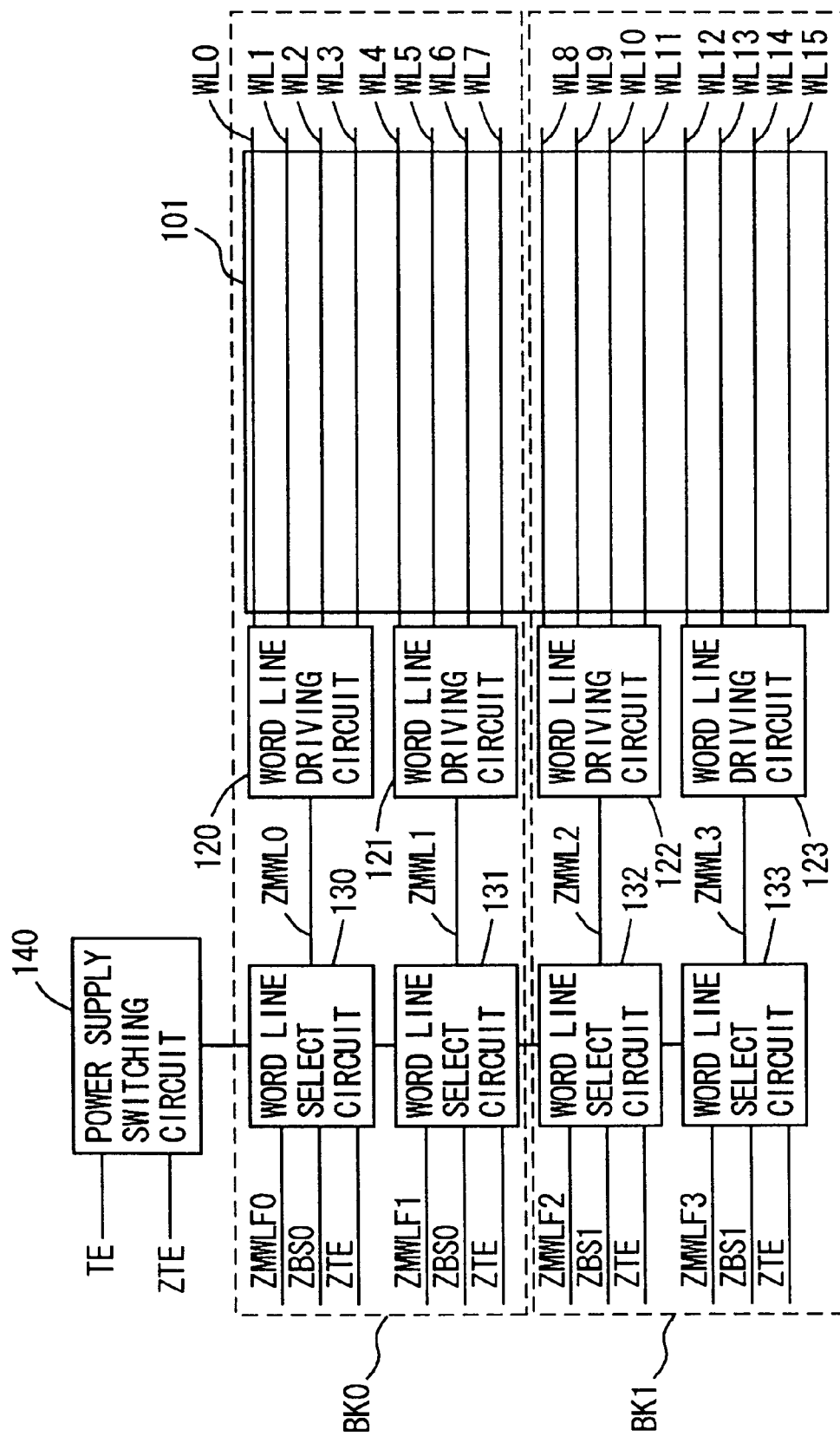
F I G. 6

WHEN ZMWL IS SELECTED

WHEN ZMWL IS NON-SELECTED

SEMICONDUCTOR MEMORY DEVICE CAPABLE OF IMPOSING LARGE STRESS ON TRANSISTOR

BACKGROUND OF THE INVENTION

1. Field of the Invention

The present invention relates to semiconductor memory devices, and more particularly to a semiconductor memory device capable of placing large stress on a specific transistor in a burn-in test mode.

2. Description of the Background Art

FIG. 19 is a circuit diagram showing configurations of a word line driver and its peripheral in a conventional dynamic random access memory (DRAM). Referring to FIG. 19, the word line driver 1 for driving a word line WL includes a P channel MOS transistor 2 and N channel MOS transistors 3 and 4. A memory cell 5 is connected to word line WL and a bit line BL.

When word line WL is selected, as shown in FIG. 20A, a sub-decode signal φ attains an H (logical high) level (of a boosted potential Vpp greater than a power supply potential), a sub-decode signal Zφ attains an L (logical low) level (of a ground potential), and the potential of a main word line ZMWL (i.e., a main word line select signal) attains an L level. As a result, transistor 2 turns on and transistors 3 and 4 turn off, so that the potential of word line WL becomes boosted potential Vpp. Throughout the specification and drawings, a reference character "Z" prefixed to any signal indicates that the relevant signal is low active.

When word line WL is not selected, as shown in FIG. 20B, although sub-decode signal φ attains an H level and sub-decode signal Zφ attains an L level, the potential of main word line ZMWL (main word line select signal) is maintained at the H level (of boosted potential Vpp greater than the power supply potential). As a result, transistors 3 and 4 turn on, and transistor 2 basically turns off, while a small leakage current Ilk flows in transistor 2. If this leakage current Ilk is large, the potential of word line WL will become greater than the ground potential, which is likely to damage data of memory cell 5. Any DRAM having P channel MOS transistor 2 with such a large leakage current Ilk should be eliminated from end products.

FIG. 21 is a circuit diagram showing configurations of a sense amplifier and its peripheral in a conventional DRAM. Referring to FIG. 21, the sense amplifier 6 is connected to a bit line pair BL, ZBL through a bit line isolating gate 7. Sense amplifier 6 is also connected to an input/output line pair I/O, ZI/O through a column select gate 8. Column select gate 8 is formed of N channel MOS transistors 81 and 82. Connected to input/output line pair I/O, ZI/O is a write driver 9 that responds to a write driver enable signal ZWDE and transmits write data WD to bit line pair BL, ZBL. An equalizing circuit 10 is also connected to input/output line pair I/O, ZI/O, which responds to an equalizing signal IOEQ and equalizes the potentials of input/output lines I/O and ZI/O.

When data is being written, as shown in FIG. 22, a bit line isolating signal BLI attains an H level, a bit line isolating gate 7 is turned on, and bit line pair BL, ZBL is connected to sense amplifier 6. Thereafter, when sense amplifier 6 is activated, data of an L level is read out in this example, so that bit line pair BL attains a potential of an L level, and bit line ZBL attains a potential of an H level. Thereafter, when write driver enable signal ZWDE attains an L level, write driver 9 responds to write data WD of an H level in this example, and drives the potential of input/output line I/O to an H level and the potential of input/output line ZI/O to an L level. Thereafter, when a column select signal CSL attains an H level, column select gate 8 is turned on, and the potentials of input/output line pair I/O, ZI/O are transmitted to bit line pair BL, ZBL. In this case, although the potentials of bit line pair BL, ZBL are opposite to the potentials of input/output line pair I/O, ZI/O, write driver 9 is able to reverse the potentials of bit line pair BL, ZBL, since it has driving capability greater than that of sense amplifier 6. Specifically, the potential of bit line BL is turned to an H level, and the potential of bit line ZBL is turned to an L level.

If transistors 81 and 82 of column select gate 8 each have a large ON resistance, however, the potentials of input/output line pair I/O, ZI/O will not be transmitted sufficiently to bit line pair BL, ZBL while column select signal CSL is at an H Level. In this case, write driver 9 will fail to reverse the potentials of bit line pair BL, ZBL, causing an error in data writing. Therefore, any DRAM having transistors 81, 82 with such large ON resistances should be eliminated from end products.

A conceivable way of finding the former defective transistor 2 will be, in a burn-in test, to raise the potential of sub-decode signal φ greater than boosted potential Vpp and repeat selection/non-selection of word line WL to accelerate the stress being imposed on transistor 2, thereby increasing leakage current Ilk. In this case, however, an enormous amount of consumption current will flow. Thus, due to the constraint of the burn-in tester, the frequency of repetition of the selection/non-selection of the word line is limited to some extent.

A possible way to find the latter defective transistors 81, 82 will be, in a burn-in test, to repeat writing of data of an H level and data of an L level to accelerate the stress being imposed on transistors 81, 82, thereby increasing the ON resistances thereof. However, a huge amount of consumption current will flow again in this case. Thus, due to the constraint of the burn-in tester, the data writing cannot be repeated so frequently.

SUMMARY OF THE INVENTION

An object of the present invention is to provide a semiconductor memory device capable of imposing large stress on a specific transistor.

According to an aspect of the present invention, the semiconductor memory device includes a word line, a word line driver, and a word line select circuit. The word line driver drives the word line. The word line select circuit generates a word line select signal for selecting the word line. The word line driver includes a first transistor and a second transistor. The first transistor has one conductive electrode receiving a boosted potential greater than a power supply potential, another conductive electrode connected to the word line, and a control electrode receiving the word line select signal. The second transistor has one conductive electrode grounded, another conductive electrode connected to the word line, and a control electrode receiving the word line select signal. The semiconductor memory device further includes a turn-on circuit which causes the first transistor to turn on in response to a test signal.

In this semiconductor memory device, the first transistor is turned on in response to the test signal even when the word line is non-selected, and a leakage current flows in the first transistor. As a result, it is possible to impose large stress on the first transistor.

According to another aspect of the present invention, the semiconductor memory device includes a plurality of blocks, each of which is selected in response to a corresponding block select signal. Each block includes a word line, a word line driver, and a word line select circuit. The word line driver drives the word line. The word line select circuit generates a word line select signal for selecting the word line. The word line driver includes a first transistor and a second transistor. The first transistor has one conductive electrode receiving a boosted potential greater than a power supply potential, another conductive electrode connected to the word line, and a control electrode receiving the word line select signal. The second transistor has one conductive electrode grounded, another conductive electrode connected to the word line, and a control electrode receiving the word line select signal. The semiconductor memory device further includes a turn-on circuit. The turn-on circuit causes the first transistor in selected one of the blocks to turn on in response to a test signal.

In this semiconductor memory device, the first transistor is turned on in response to the test signal even if the word line is not selected, so that a leakage current flows in the first transistor. As a result, it is possible to impose large stress on the first transistor. In addition, the leakage current flows only in the selected block, not in a non-selected block. This reduces current consumption during the test.

Preferably, the turn-on circuit responds to the test signal and drives the word line select signal to a potential lower than the boosted potential.

Still preferably, the turn-on circuit provides a power supply of the word line select circuit with a potential lower than the boosted potential when the test signal is in an active state, and provides the same with the boosted potential when the test signal is in an inactive state. The word line select circuit drives the word line select signal to a ground potential when the word line is selected, and drives the same to the potential provided to the power supply of the word line select circuit when the word line is not selected.

According to a further aspect of the present invention, the semiconductor memory device includes a plurality of bit line pairs, a plurality of sense amplifiers, an input/output line pair, a plurality of column select gates, and a turn-on circuit. The sense amplifiers are provided for the bit line pairs, and each sense amplifier is connected to the corresponding bit line pair. The column select gates are provided for the bit line pairs, and each column select gate is connected between the corresponding bit line pair and the input/output line pair. The turn-on circuit causes the column select gates to turn on in response to a test signal.

In this semiconductor memory device, the plurality of column select gates are turned on in response to the test signal, and the plurality of bit line pairs are connected to the input/output line pair. If data of an H level and data of an L level are written repeatedly at this time, large stress can be imposed on the column select gates.

Preferably, the semiconductor memory device further includes a plurality of bit line isolating gates and a turn-off circuit. The bit line isolating gates are provided for the bit line pairs. Each bit line isolating gate is connected between the corresponding bit line pair and the corresponding sense amplifier. The turn-off circuit causes the bit line isolating gates to turn off in response to the test signal.

When the plurality of bit line isolating gates are turned off in response to the test signal, the plurality of bit line pairs are disconnected from the corresponding sense amplifiers. As a result, it is unnecessary to charge/discharge the bit line pairs while repeating the data writing, and thus, the current consumption can be reduced.

According to yet another aspect of the present invention, the semiconductor memory device includes an input/output line pair and a plurality of blocks. Each block is selected in response to a corresponding block select signal. Each block includes a plurality of bit line pairs, a plurality of sense amplifiers, and a plurality of column select gates. The sense amplifiers are provided for the bit line pairs. Each sense amplifier is connected to the corresponding bit line pair. The column select gates are provided for the bit line pairs. Each column select gate is connected between the corresponding bit line pair and the input/output line pair. The semiconductor memory device further includes a turn-on circuit. The turn-on circuit causes the column select gates in selected one of the blocks to turn on in response to a test signal.

In this semiconductor memory device, the plurality of column select gates are turned on in response to the test signal, and the plurality of bit line pairs are connected to the input/output line pair. If data of an H level and data of an L level are repeatedly written at this time, large stress can be imposed on the column select gates. In addition, the plurality of bit line pairs only in the selected block are connected to the input/output line pair, while the bit line pairs in a non-selected block are not connected thereto. This reduces the current consumption during the test.

Preferably, each block further includes a plurality of bit line isolating gates. The bit line isolating gates are provided for the bit line pairs. Each bit line isolating gate is connected between the corresponding bit line pair and the corresponding sense amplifier. The semiconductor memory device further includes a turn-off circuit. The turn-off circuit causes the bit line isolating gates to turn off in response to the test signal.

When the plurality of bit line isolating gates are turned off in response to the test signal, the plurality of bit line pairs are disconnected from the corresponding sense amplifiers. As a result, it is unnecessary to charge/discharge the bit line pairs while repeating the data writing, so that the current consumption is reduced.

According to a still further aspect of the present invention, the semiconductor memory device includes a plurality of bit line pairs, a plurality of sense amplifiers, an input/output line pair, a plurality of column select gates, an equalizing circuit, a first turn-on circuit, and a second turn-on circuit. The sense amplifiers are provided for the bit line pairs. Each sense amplifier is connected to the corresponding bit line pair. The column select gates are provided for the bit line pairs. Each column select gate is connected between the corresponding bit line pair and the input/output line pair. The equalizing circuit is connected to the input/output line pair. The first turn-on circuit causes the column select gates to turn on in response to a test signal. The second turn-on circuit causes the equalizing circuit to turn on in response to the test signal.

In this semiconductor memory device, the plurality of column select gates and the equalizing circuit are turned on in response to the test signal, and the plurality of bit line pairs are connected to the input/output line pair, and further the input/output line pair is short-circuited. As a result, a leakage current flows between two sense nodes of the respective sense amplifiers via the corresponding column select gates, the input/output line pair and the equalizing circuit. Accordingly, large stress can be imposed on the column select gates.

According to yet another aspect of the present invention, the semiconductor memory device includes an input/output line pair, an equalizing circuit, and a plurality of blocks. The equalizing circuit is connected to the input/output line pair. Each block is selected in response to a corresponding block select signal. Each block includes a plurality of bit line pairs, a plurality of sense amplifiers, and a plurality of column select gates. The sense amplifiers are provided for the bit line pairs. Each sense amplifier is connected to the corresponding bit line pair. The column select gates are provided for the bit line pairs. Each column select gate is connected between the corresponding bit line pair and the input/output line pair. The semiconductor memory device further includes a first turn-on circuit and a second turn-on circuit. The first turn-on circuit causes the column select gates in selected one of the blocks to turn on in response to a test signal. The second turn-on circuit causes the equalizing circuit to: turn on in response to the test signal.

In this semiconductor memory device, the plurality of column select gates and the equalizing circuit are turned on in response to the test signal, and the plurality of bit line pairs are connected to the input/output line pair, and further the input/output line pair is short-circuited. As a result, a leakage current flows between two sense nodes of the respective sense amplifiers via the corresponding column select gates, the input/output line pair and the equalizing circuit, and large stress is imposed on the column select gates. In addition, the bit line pairs only within the selected block are connected to the input/output line pair, and the bit line pairs within a non-selected block are not connected thereto. Thus, the current consumption during the test is reduced.

According to the present invention, the transistor constituting the word line driver is forcibly turned on in response to a test signal, and thus, a through current flows in the word line driver even when the word line is not selected. As a result, it is possible to impose large stress on the transistor constituting the word line driver.

Further, a plurality of column select gates are forcibly turned on in response to a test signal, and thus, a plurality of sense amplifiers are connected to the input/output line pair. As a result, it is possible, by repeating writing of H-level data and L-level data, to impose large stress on the transistor constituting the column select gate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 6 is a block diagram showing a main configuration of the DRAM according to a second embodiment of the present invention.

DESCRIPTION OF THE PREFERRED EMBODIMENTS

Figure 1:
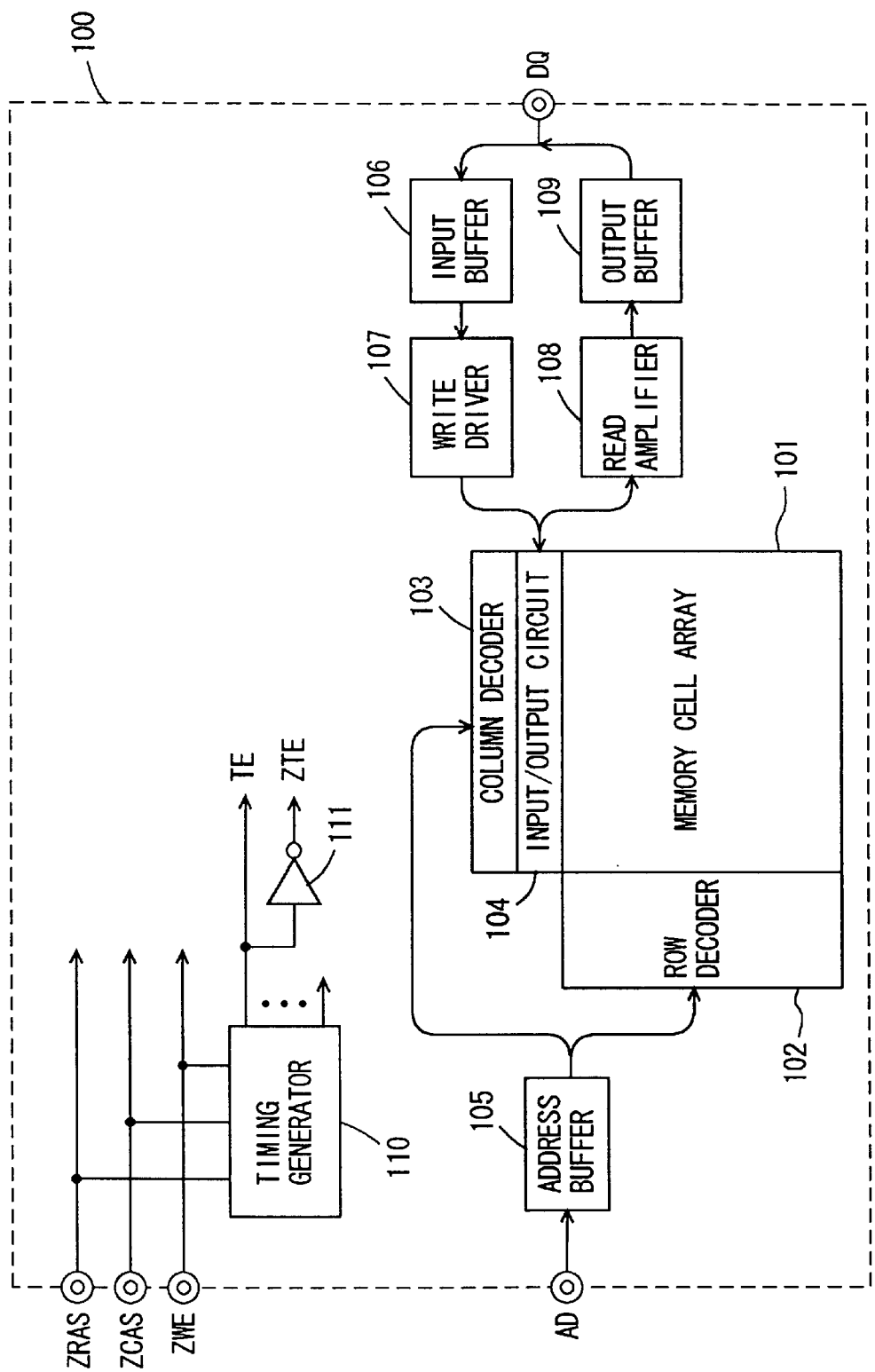
FIG. 1 is a block diagram showing an entire configuration of the DRAM according to a first embodiment of the present invention.

Hereinafter, embodiments of the present invention will be described with reference to the drawings, through which the same or corresponding portions are denoted by the same reference character, and description thereof is not repeated where appropriate.

First Embodiment

Referring to FIG. 1, the DRAM 100 according to the first embodiment includes a memory cell array 101, a row decoder 102, a column decoder 103, an input/output circuit 104, an address buffer 105, an input buffer 106, a write driver 107, a read amplifier 108, an output buffer 109, a timing generator 110, and an inverter 111.

Memory cell array 101 includes a plurality of memory cells (not shown) arranged in a matrix, a plurality of word lines (not shown) arranged in rows, and a plurality of bit line pairs (not shown) arranged in columns. Row decoder 102 responds to a row address signal and selects a word line within memory cell array 101. Column decoder 103 responds to a column address signal and selects a bit line pair within memory cell array 101. Input/output circuit 104 inputs data to and outputs data from the bit line pair selected by column decoder 103. Address buffer 105 receives an externally supplied address signal AD and applies it as the row address signal to row decoder 102 and as the column address signal to column decoder 103. Input buffer 106 provides externally supplied data DQ to write driver 107. Write driver 107 provides the write data received from input buffer 106 to input/output circuit 104. Read amplifier 108 provides read data received from input/output circuit 104 to output buffer 109. Output buffer 109 externally outputs the read data received from read amplifier 108. Timing generator 110 responds to externally supplied row address strobe signal ZRAS, column address strobe signal ZCAS, write enable signal ZWE and others, and generates a variety of signals for control of internal circuits of DRAM 100. In the burn-in test mode, a test signal TE of an H level and a test signal ZTE of an L level are generated. For example, timing generator 110 generates test signal TE when it detects an address key in a WCBR (WE, CAS before RAS) mode.

Figure 2:
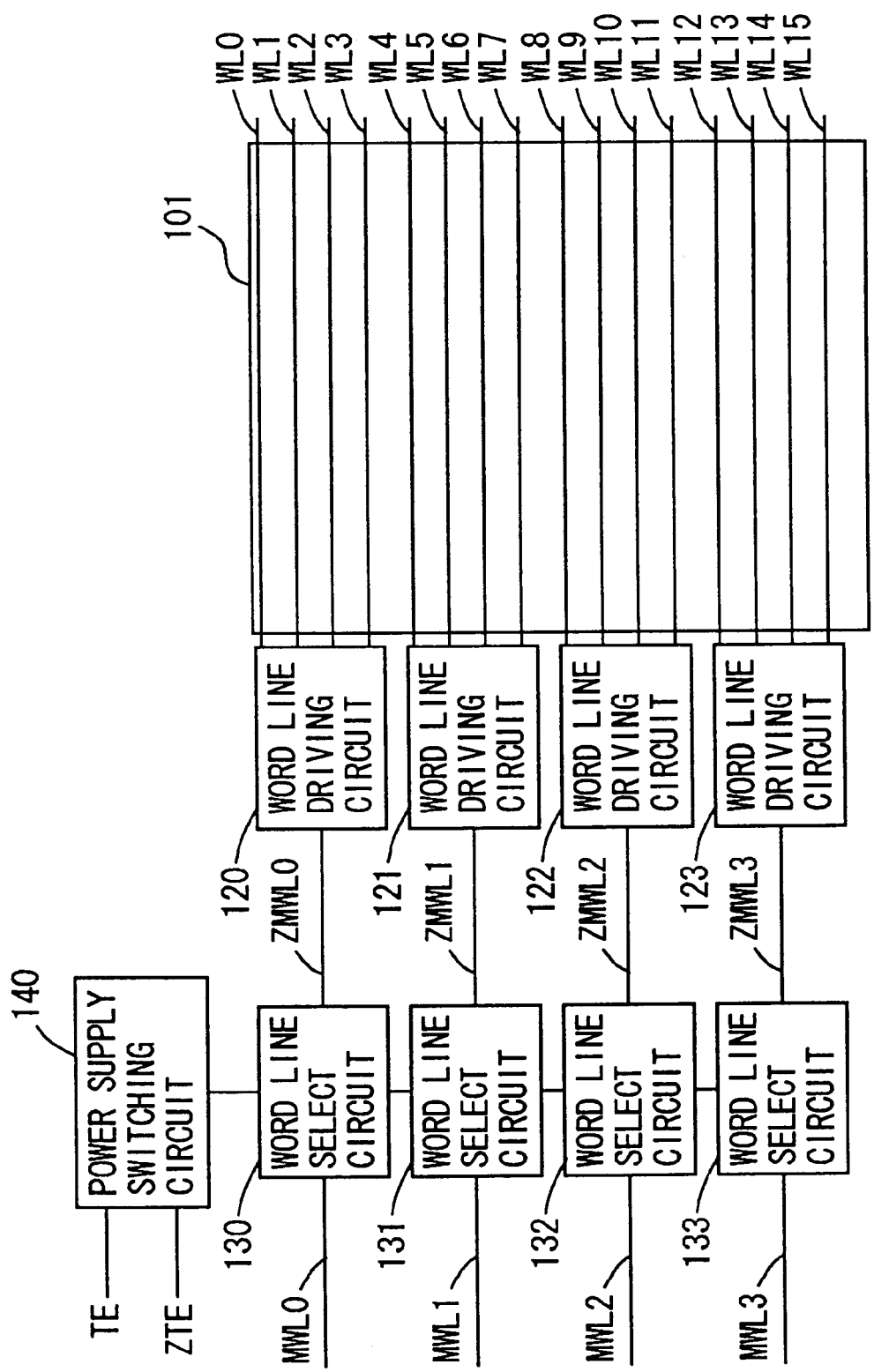
FIG. 2 is a block diagram showing configurations of the memory cell array and the row decoder in FIG. 1.

Referring to FIG. 2 showing the configurations of memory cell array 101 and row decoder 102 in FIG. 1, memory cell array 101 includes a plurality of word lines arranged in rows. In FIG. 2, 16 word lines WL0–WL15 are shown representatively.

DRAM 100 has a so-called hierarchical (or divided) word line configuration, in which main word lines are provided for word lines. In FIG. 2, four main word lines ZMWL0–ZMWL3 are shown representatively. Specifically, one main word line ZMWL0 is provided corresponding to four word lines WL0–WL3.

Further, word line driving circuits are provided corresponding to the main word lines. In FIG. 2, four word line driving circuits 120–123 are shown representatively. More specifically, one word line driving circuit 120 is provided corresponding to four word lines WL0–WL3. Word line driving circuits 120–123 each drive one of the corresponding four word lines when the corresponding main word line is selected.

Still further, word line select circuits are provided corresponding to the main word lines. In FIG. 2, four word line select circuits 130–133 are shown representatively. When a main word line select signal MWL0 attains an H level (of a boosted potential greater than a power supply potential), word line select circuit 130 drives the potential of main word line ZMWL0 (main word line select signal) to a ground potential. Other word line select circuits 131–133 each have the same function as word line select circuit 130.

A power supply switching circuit 140 is provided for a plurality of word line select circuits. Power supply switching circuit 140 provides word line select circuits 130–133 with a power supply potential when test signals TE and ZTE are activated. When test signals TE and ZTE are inactivated, it provides word line select circuits 130–133 with a boosted potential greater than the power supply potential.

Figure 3:
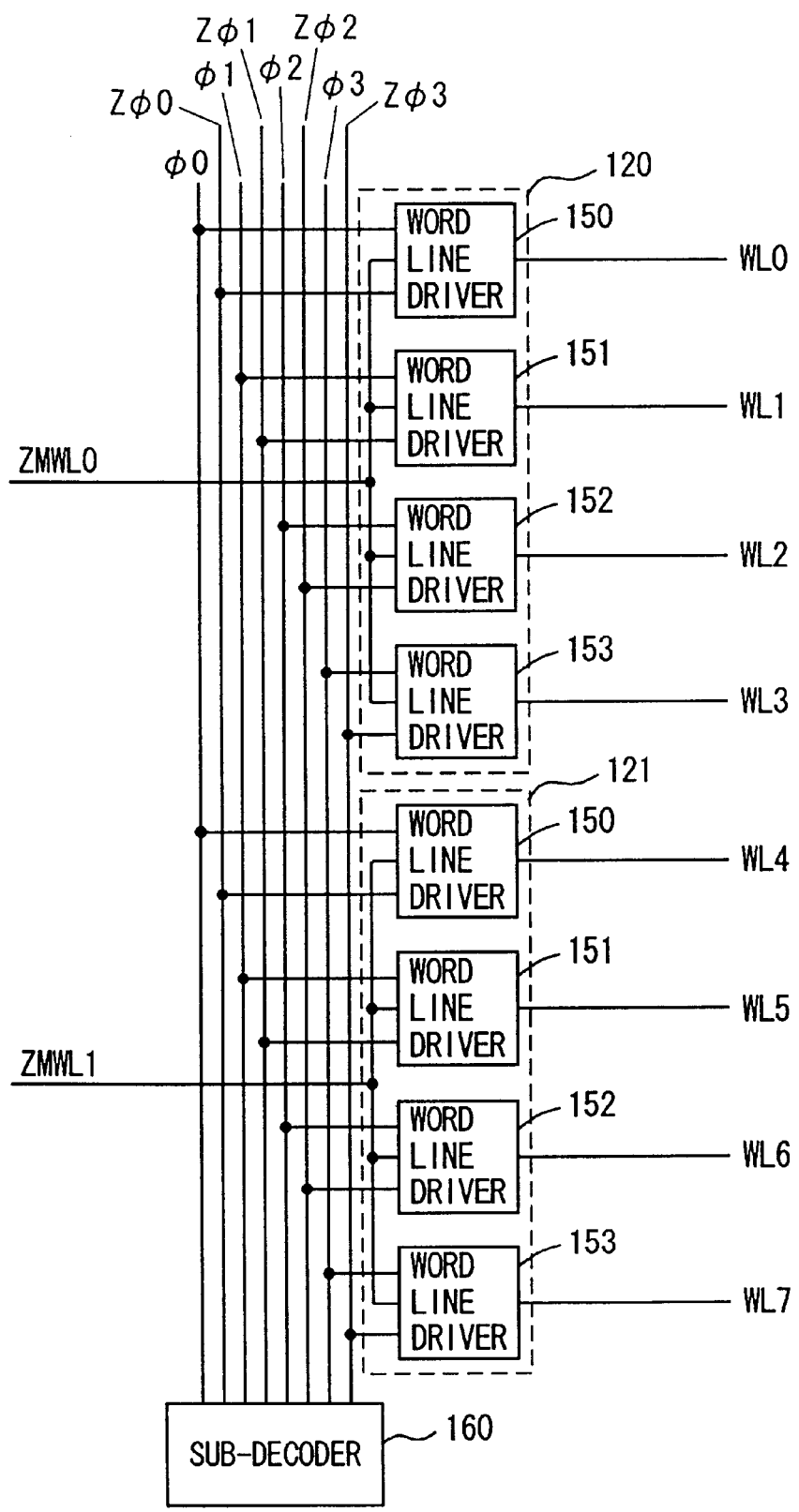
FIG. 3 is a block diagram showing configurations of the word line driving circuit and its peripheral in FIG. 2.

FIG. 3 shows the configurations of the word line driving circuits in FIG. 2 and their peripherals. In FIG. 3, two word line driving circuits 120 and 121 are shown representatively. Word line driving circuits 120 and 121 each include four word line drivers 150–153. Word line drivers 150–153 are all connected to a corresponding main word line, and each of word line drivers 150–153 is connected to a corresponding word line.

A sub-decoder 160 is provided for the plurality of word line drivers 150–153. Sub-decoder 160 responds to a row address signal and selects one of four word line drivers 150–153. For example, word line driver 150 is selected when a sub-decode signal φ0 attains a boosted potential greater than the power supply potential and a sub-decode signal Zφ0 attains a ground potential. If sub-decode signal φ1 attains an H level and sub-decode signal Zφ1 attains an L level while the potential of main word line ZMWL1 is at an L level, then word line driver 151 within word line driving circuit 121 is selected, and word line WL5 is driven.

Figure 4:
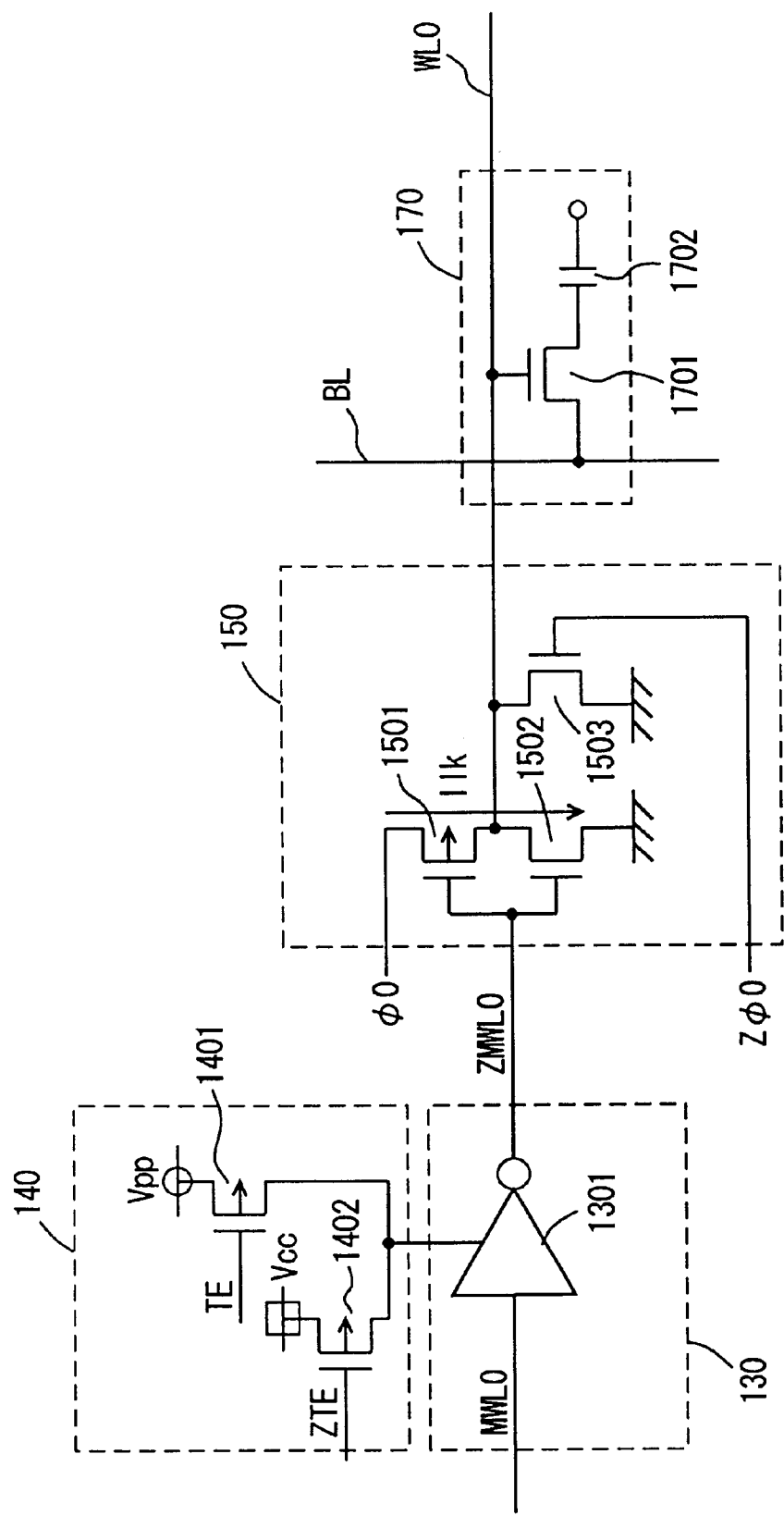
FIG. 4 is a circuit diagram showing configurations of the power supply switching circuit and the word line select circuit shown in FIG. 2, the word line driver in FIG. 3, and a memory cell.

FIG. 4 shows configurations of word line select circuit 130, power supply switching circuit 140, and word line driver 150 in FIGS. 2 and 3, and a memory cell 170. Referring to FIG. 4, word line select circuit 130 includes an inverter 1301 that has an input node receiving main word line select signal MWL0 and an output node connected to main word line ZMWL0.

Power supply switching circuit 140 includes P channel MOS transistors 1401 and 1402. Transistor 1401 turns on when test signal TE is inactivated to an L level, and provides boosted potential Vpp greater than power supply potential Vcc to a power supply of inverter 1301. Transistor 1402 turns on when test signal ZTE is activated to an L level, and provides power supply potential Vcc to the power supply of inverter 1301.

Word line driver 150 includes a P channel MOS transistor 1501 and N channel MOS transistors 1502 and 1503. Transistor 1501 has a source receiving sub-decode signal φ0, a drain connected to word line WL0, and a gate connected to main word line ZMWL0. Transistor 1502 has a source grounded, a drain connected to word line WL0, and a gate connected to main word line ZMWL0. Transistor 1503 has a grounded source, a drain connected to word line WL0, and a gate receiving sub-decode signal Zφ0.

Memory cell 170 includes an access transistor 1701 and a capacitor 1702. Memory cell 170 is connected to word line WL0 and bit line BL.

In normal reading and writing modes, test signal TE is inactivated to an L level and test signal ZTE is inactivated to an H level. Therefore, transistor 1401 turns on, transistor 1402 turns off, and power supply switching circuit 140 provides boosted potential Vpp to word line select circuits 130–133.

When main word line select signal MWL0 attains an H level, the potential of main word line ZMWL0 becomes an L level. At this time, when sub-decode signal φ0 attains an H level (of boosted potential Vpp) and sub-decode signal Zφ0 attains an L level, transistor 1501 turns on and transistors 1502 and 1503 turn off. As a result, the potential of word line WL0 becomes boosted potential Vpp.

By comparison, when main word line select signal MWL0 attains an L level, the potential of main word line ZMWL0 becomes an H level (of boosted potential Vpp), and transistor 1501 turns off and transistor 1502 turns on. As a result, the potential of word line WL0 becomes the ground potential, irrelevant to sub-decode signals φ0, Zφ0.

Figure 5:
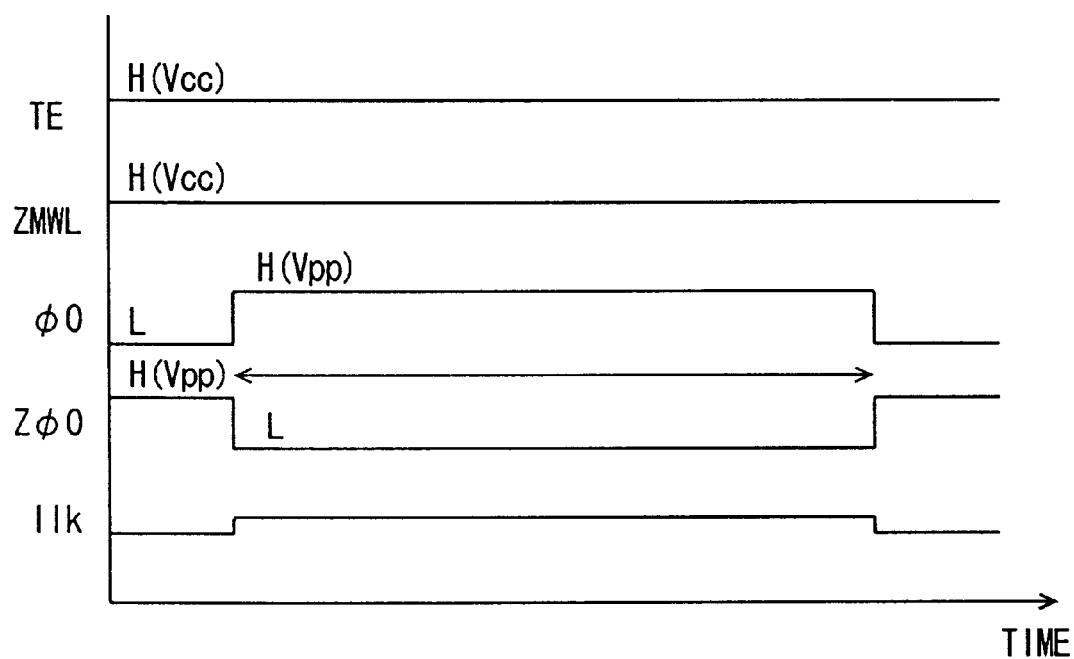
FIG. 5 is a timing chart illustrating an operation of the DRAM shown in FIGS. 1–4 in a burn-in test mode.

The operation in the burn-in test mode will now be described with reference to the timing chart of FIG. 5.

In the burn-in test mode, test signal TE is activated to an H level and test signal ZTE is activated to an L level. Thus, transistor 1401 turns off and transistor 1402 turns on, and power supply switching circuit 140 provides power supply potential Vcc to word line select circuits 130–133.

The operation in the case where main word line select signal MWL0 is at an H level is the same as described above. When main word line select signal MWL0 is at an L level, the potential of main word line ZMWL0 becomes power supply potential Vcc. Thus, transistor 1502 turns on, and the potential of word line WL0 basically becomes the ground potential. If sub-decode signal φ0 attains boosted potential Vpp, however, the gate potential of transistor 1501 (power supply potential Vcc) becomes lower than the source potential (boosted potential Vpp). If Vpp=5V, Vcc=3V and Vth (threshold value of transistor 1501)=1V, then not only transistor 1502 but also transistor 1501 turn on. As a result, leakage current Ilk running through word line driver 150 will flow into transistor 1501 even when word line WL0 is not selected. Here, the time period during which leakage current Ilk flows can be adjusted by controlling the time period during which sub-decode signal φ0 is at an H level.

As explained above, according to the first embodiment of the present invention, transistor 1501 is forcibly turned on in response to test signals TE, ZTE even when word line WL0 is not selected, and thus, in the burn-in test mode, leakage current Ilk steadily flows into transistor 1501. As a result, it is possible to impose large stress on transistor 1501, without repeating selection/non-selection of word line WL0.

Second Embodiment

FIG. 6 shows the main configuration of the DRAM according to the second embodiment. As shown in FIG. 6, the second embodiment differs from the first embodiment shown in FIG. 2 in that the word lines, word line driving circuits, word line select circuits and others are divided into a plurality of blocks. In FIG. 6, two blocks BK0 and BK1 are shown representatively. Block BK0 includes word lines WL0–WL7, word line driving circuits 120, 121 and word line select circuits 130, 131. Block BK1 includes word lines WL8–WL15, word line driving circuits 122, 123 and word line select circuits 132, 133. Block BK0 is selected in response to a block select signal ZBS0. Block BK1 is selected in response to a block select signal ZBS1.

Figure 7:
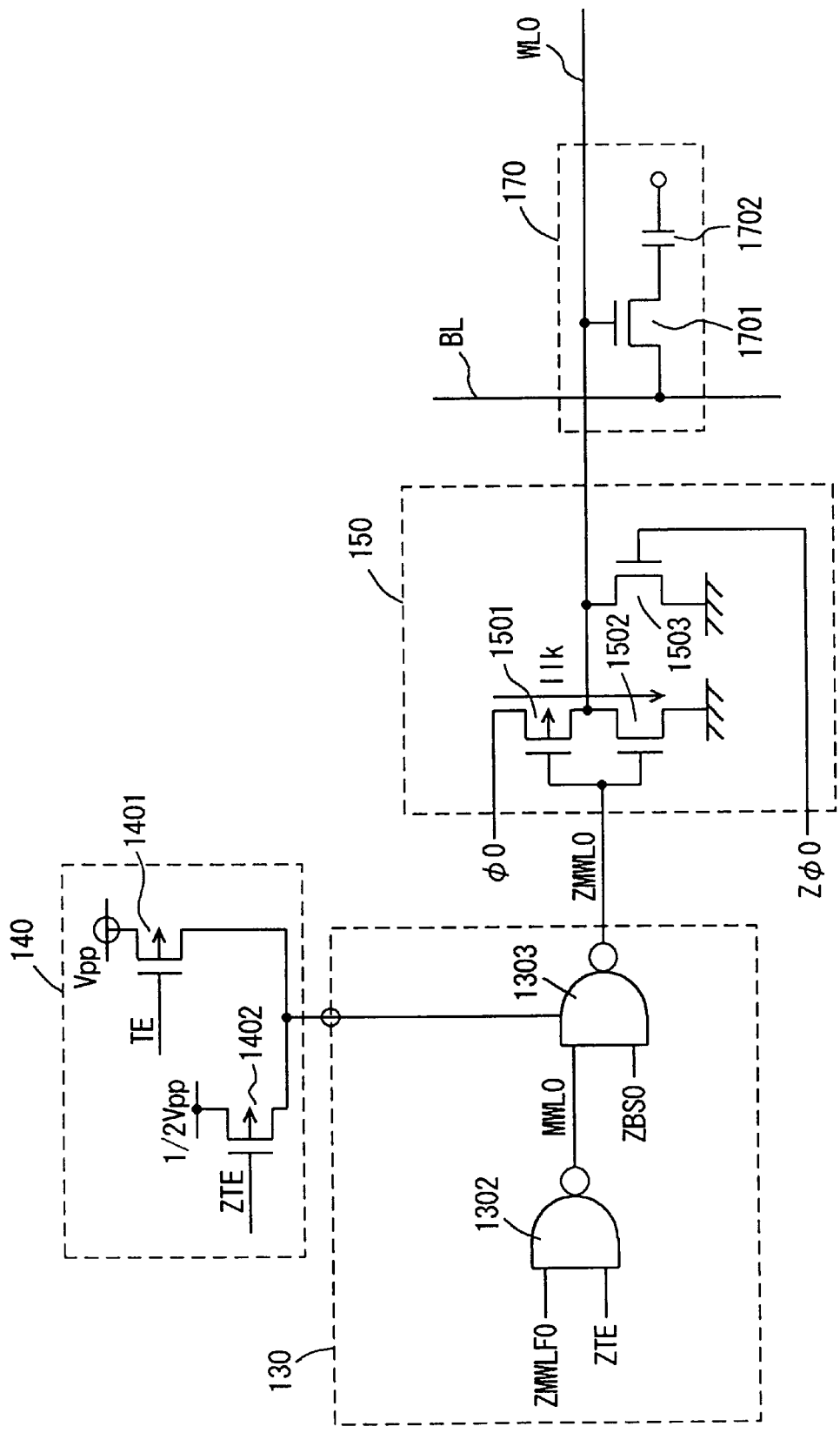
FIG. 7 is a circuit diagram showing configurations of the power supply switching circuit, the word line select circuit, and a word line driver within the word line driving circuit in FIG. 6, and a memory cell.

FIG. 7 shows configurations of power supply switching circuit 140, word line select circuit 130, and word line driver 150 within word line driving circuit 120 shown in FIG. 6, and a memory cell 170. Here, transistor 1402 turns on when test signal ZTE is activated to an L level, and as a result, power supply switching circuit 140 provides word line select circuits 130–133 with a potential that is half the boosted potential Vpp (hereinafter, "half boosted potential") Vpp/2.

Word line select circuit 130 includes NAND circuits 1302 and 1303. NAND circuit 1302 receives main word line select signal ZMWLF0 and test signal ZTE and provides main word line select signal MWL0 to NAND circuit 1303. NAND circuit 1303 receives main word line select signal MWL0 and block select signal ZBS0 and provides the main word line select signal to main word line ZMWL0. The potential from power supply switching circuit 140 is provided to a power supply of NAND circuit 1303. Other word line select circuits 131–133 each have the same configuration as word line select circuit 130.

Figure 8:
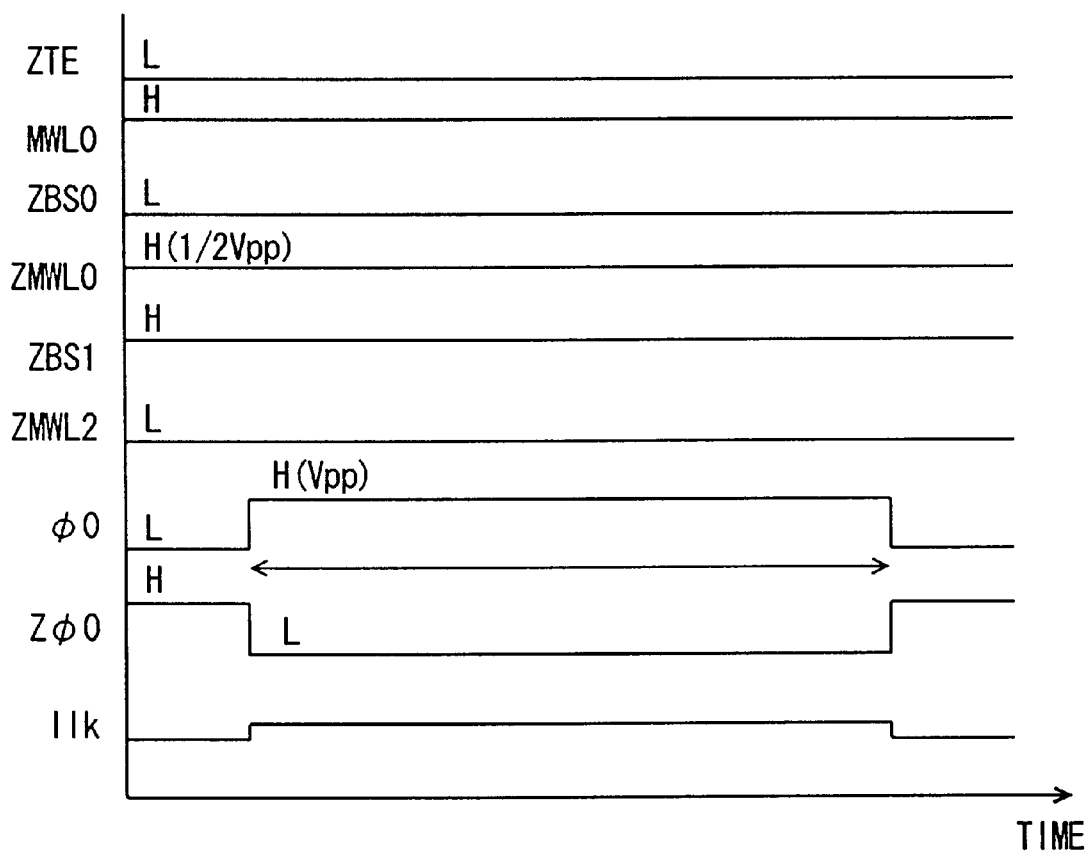
FIG. 8 is a timing chart illustrating an operation of the DRAM of the second embodiment shown in FIGS. 6 and 7 in the burn-in test mode.

In the burn-in test mode, as shown in FIG. 8, test signal ZTE is activated to an L level, so that power supply switching circuit 140 provides half boosted potential Vpp/2 to word line select circuits 130–133.

When block BK0 is being selected, block select signal ZBS0 is activated to an L level, and the potential of main word line ZMWL0 becomes an H level (of half boosted potential Vpp/2), regardless of main word line select signal MWL0. If sub-decode signal φ0 attains an H level (of boosted potential Vpp) in this state, the gate potential of transistor 1501 (half boosted potential Vpp/2) becomes lower than the source potential (boosted potential Vpp). Thus, not only transistor 1502 but also transistor 1501 turn on, and leakage current Ilk running through word line driver 150 comes to flow. As a result, large stress is imposed on transistor 1501. In this embodiment, again, the time period during which leakage current Ilk flows can be adjusted by controlling the time period where sub-decode signal φ0 is at an H level.

In non-selected block BK1, block select signal ZBS1 is at an H level. Accordingly, main word line ZMWL2 is driven to a selected state in response to test signal ZTE at an L level, or, the potential of main word line ZMWL2 becomes an L level, and thus, transistor 1502 is turned off. As a result, there will be no leakage current Ilk flowing through transistors 1501 and 1502 even if sub-decode signal φ0 attains an H level and transistor 1501 is turned on.

As described above, according to the second embodiment of the present invention, it is possible to make leakage current Ilk flow to impose large stress only on transistor 1501 within a selected block. Accordingly, the current consumption in the burn-in test mode, and hence, the load on the burn-in tester can be reduced.

In the second embodiment, transistor 1402 provides half boosted potential Vpp/2 to the power supply of NAND circuit 1303 in response to test signal ZTE. Alternatively, it can provide power supply potential Vcc, instead of half boosted potential Vpp/2, as in the first embodiment. Conversely, in the first embodiment, transistor 1402 provides power supply potential Vcc to the power supply of inverter 1301 in response to test signal ZTE. Alternatively, it can provide half boosted potential Vpp/2 thereto, as in the second embodiment.

Third Embodiment

Figure 9:
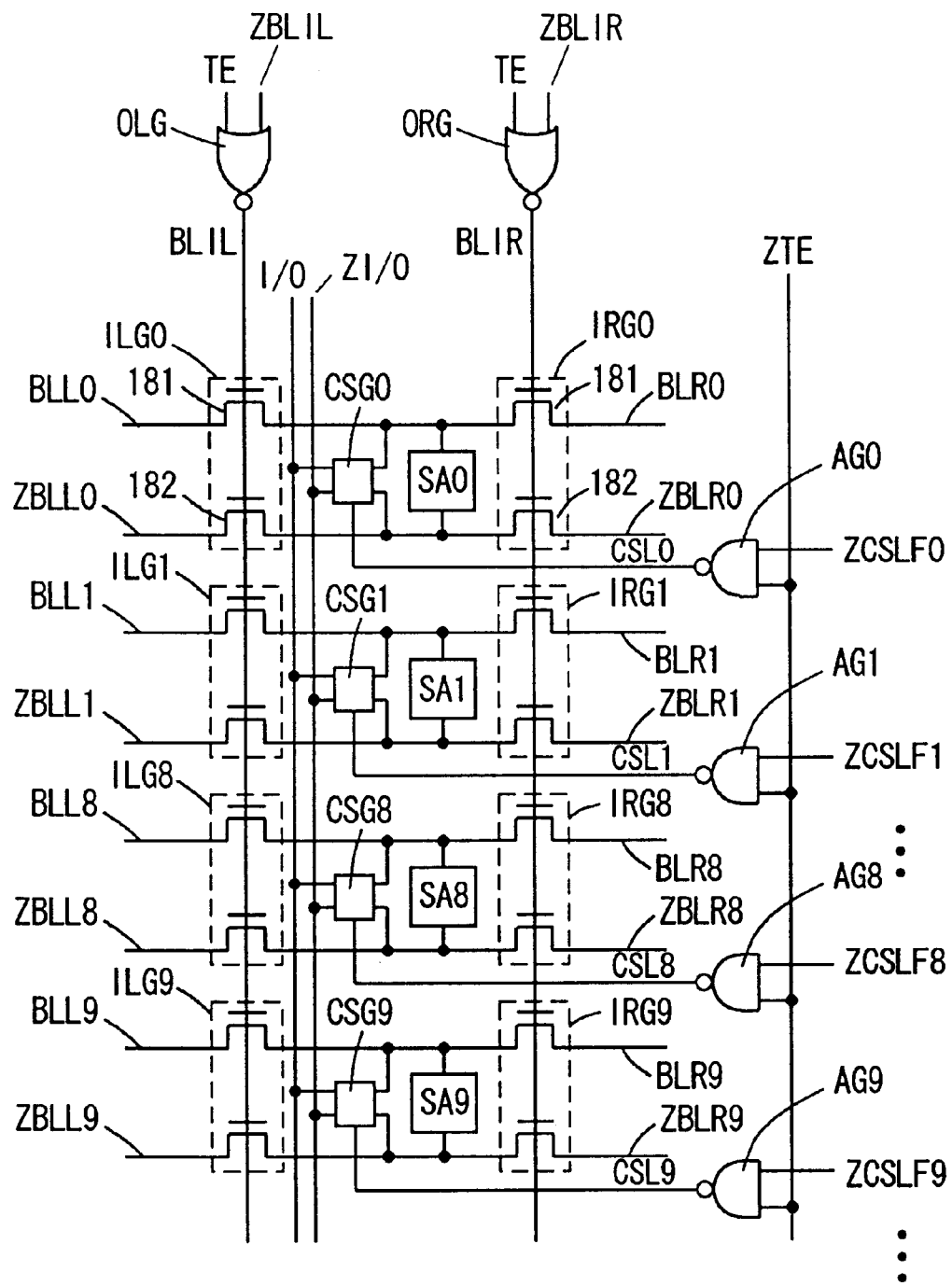
FIG. 9 is a block diagram showing a main configuration of the DRAM according to a third embodiment of the present invention.

FIG. 9 shows the main configuration of the DRAM according to the third embodiment. Referring to FIG. 9, sense amplifiers are provided for bit line pairs. Here, one sense amplifier is provided corresponding to two bit line pairs. In FIG. 9, bit line pairs BLL0, ZBLL0, BLL1, ZBLL1, BLL8, ZBLL8, BLL9, ZBLL9, BLR0, ZBLR0, BLR1, ZBLR1, BLR8, ZBLR8, BLR9, ZBLR9, and sense amplifiers SA0, SA1, SA8, SA9 are shown representatively.

Further, bit line isolating gates are provided corresponding to the bit line pairs. In FIG. 9, bit line isolating gates ILG0, ILG1, ILG8, ILG9, IRG0, IRG1, IRG8, IRG9 are shown representatively. Bit line isolating gate ILG0 includes N channel MOS transistors 181 and 182, and is connected between bit line pair BLL0, ZBLL0 and sense amplifier SA0. Other bit line isolating gates ILG1, ILG8, ILG9, IRG0, IRG1, IRG8, IRG9 each have the same configuration as bit line isolating gate ILG0. Bit line isolating gates ILG0, ILG1, ILG8, ILG9 turn off when a bit line isolating signal BLIL attains an L level, and turn on when bit line isolating signal BLIL attains an H level. Bit line isolating gates IRG0, IRG1, IRG8, IRG9 turn off when a bit line isolating signal BLIR attains an L level, and turn on when bit line isolating signal BLIR attains an H level. The relevant DRAM has a so-called shared sense amplifier configuration, and one of the two bit line pairs is disconnected from the corresponding sense amplifier at the time of data reading.

Further, column select gates are provided for the bit line pairs. Here, one column select gate is provided for two bit line pairs. In FIG. 9, column select gates CSG0, CSG1, CSG8, CSG9 are shown representatively. Column select gate CSG0 is connected between bit line pairs BLL0, ZBLL0, BLR0, ZBLR0 and input/output line pair I/O, ZI/O. Column select gate CSG0 turns on in response to a column select signal CSL0. Other column select gates CSG1, CSG8, CSG9 each have the same configuration as the gate CSG0.

Here, bit line isolating signal BLIL is generated by a NOR circuit OLG which receives test signal TE and bit line isolating signal ZBLIL. Bit line isolating signal BLIR is generated by a NOR circuit ORG which receives test signal TE and bit line isolating signal ZBLIR. Column select signal CSL0 is generated by a NAND circuit AG0 which receives test signal ZTE and column select signal ZCSL0. Column select signal CSL1 is generated by a NAND circuit AG1 which receives test signal ZTE and column select signal ZCSL1. Column select signal CLS8 is generated by a NAND circuit AG8 which receives test signal ZTE and column select signal ZCSL8. Column select signal CSL9 is generated by a NAND circuit AG9 which receives test signal ZTE and column select signal ZCSL9.

Sense amplifiers SA0, SA1, SA8, SA9, bit line isolating gates ILG0, ILG1, ILG8, ILG9, IRG0, IRG1, IRG8, IRG9, column select gates CSG0, CSG1, CSG8, CSG9, and input/output line pair I/O, ZI/O shown in FIG. 9 are included in input/output circuit 104 in FIG. 1.

Figure 10:
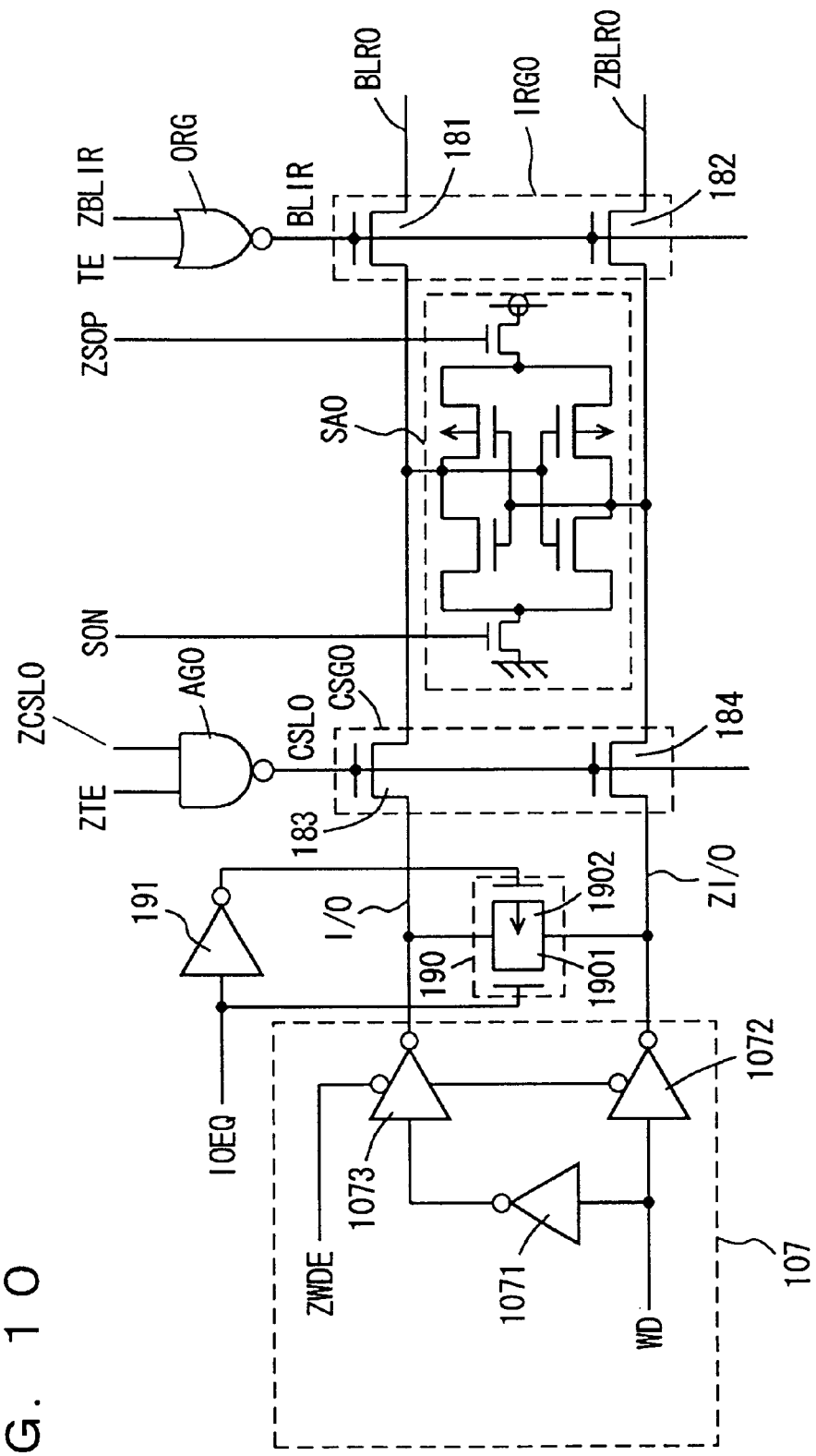
FIG. 10 is a circuit diagram showing configurations of the sense amplifier, the bit line isolating gate, the column select gate, and the input/output line pair in FIG. 9, and the write driver.

FIG. 10 shows configurations of sense amplifier SA0, bit line isolating gate IRG0, column select gate CSG0, and input/output line pair I/O, ZI/O in FIG. 9, and write driver 107 in FIG. 1. Referring to FIG. 10, column select gate CSG0 includes N channel MOS transistors 183 and 184. Connected between input/output lines. I/O and ZI/O is an equalizing circuit 190. Equalizing circuit 190 includes an N channel MOS transistor 1901 and a P channel MOS transistor 1902. Transistor 1901 has a gate receiving an equalizing signal IOEQ. Transistor 1902 has a gate receiving equalizing signal IOEQ via an inverter 191. Thus, equalizing circuit 190 turns on in response to equalizing signal IOEQ, and equalizes the potentials of input/output lines I/O and ZI/O.

Write driver 107 includes inverters 1071–1073. Inverters 1072 and 1073 are activated in response to a write driver enable signal ZWDE of an L level. Write data WD is provided to input/output line ZI/O via inverter 1072. Write data WD is also provided to input/output line I/O via inverters 1071 and 1073.

In the normal reading and writing modes, test signal TE is at an L level. Thus, bit line isolating gates ILG0, ILG1, ILG8, ILG9 are turned on/off in response to bit line isolating signal ZBLIL, and bit line isolating gates IRG0, IRG1, IRG8, IRG9 are turned on/off in response to bit line isolating signal ZBLIR. Since test signal ZTE is at an H level, column select gates CSG0, CSG1, CSG8, CSG9 are turned on/off in response to column select signals ZCSL0, ZCSL1, ZCSL8, ZCSL9, respectively.

Figure 11:
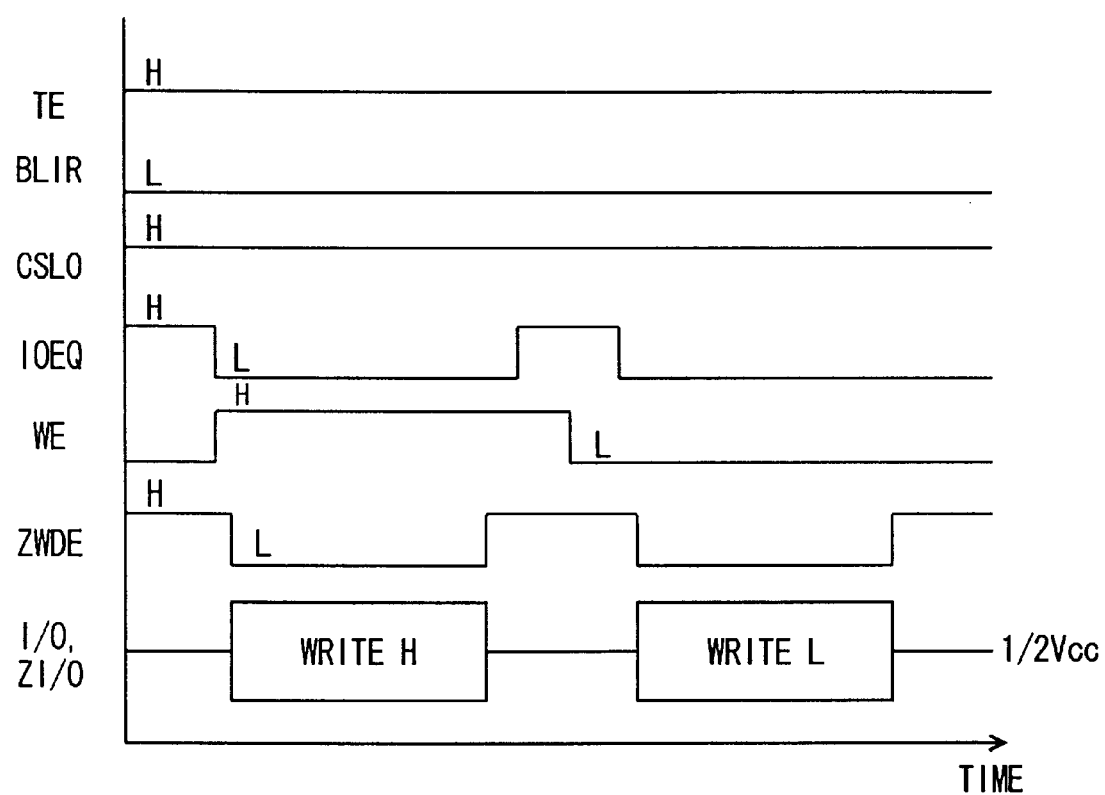
FIG. 11 is a timing chart illustrating an operation of the DRAM of the third embodiment shown in FIGS. 9 and 10 in the burn-in test mode.

In the burn-in test mode, as shown in FIG. 11, test signal TE is at an H level. Thus, bit line isolating signal BLIR attains an L level, regardless of bit line isolating signal ZBLIR, and bit line isolating signal BLIL also attains an L level. Accordingly, all the bit line isolating gates ILG0, ILG1, ILG8, ILG9, IRG0, IRG1, IRG8, IRG9 are turned off, and all the bit line pairs BLL0, ZBLL0, BLL1, ZBLL1, BLL8, ZBLL8, BLL9, ZBLL9, BLR0, ZBLR0, BLR1, ZBLR1, BLR8, ZBLR8, BLR9, ZBLR9 are disconnected from corresponding sense amplifiers SA0, SA1, SA8, SA9.

Further, as test signal ZTE is at an L level, column select signal CSL0 attains an H level, regardless of column select signal ZCSL0. Likewise, other column select signals CLS1, CSL8, CSL9 all attain an H level. Accordingly, all the column select gates CSG0, CSG1, CSG8, CSG9 are turned on, and all the sense amplifiers SA0, SA1, SA8, SA9 are connected to input/output line pair I/O, ZI/O.

Thereafter, when equalizing signal IOEQ attains an L level, equalizing circuit 190 turns off. In this state, if write data WD attains an H level and write driver enable signal ZWDE attains an L level, then write driver 107 writes data of an H level to input/output line pair I/O, ZI/O. Accordingly, the potential of input/output line I/O becomes an H level, and the potential of input/output line ZI/O becomes an L level.

Thereafter, when write data WD attains an L level, write driver 107 writes data of an L level to input/output line pair I/O, ZI/O. Thus, the potential of input/output line I/O becomes an L level, and the potential of input/output line ZI/O becomes an H level.

When write driver 107 writes the data into input/output line pair I/O, ZI/O, every column select gate CSG0, CSG1, CSG8, CSG9 is on. Thus, the data is further provided to all the sense amplifiers SA0, SA1, SA8, SA9. However, since every bit line isolating gate ILG0, ILG1, ILG8, ILG9, IRG0, IRG1, IRG8, IRG9 is off, the data will not be provided to bit line pairs BLL0, ZBLL0, BLL1, ZBLL1, BLL8, ZBLL8, BLL9, ZBLL9, BLR0, ZBLR0, BLR1, ZBLR1, BLR8, ZBLR8, BLR9, ZBLR9.

As explained above, according to the third embodiment of the present invention, every column select gate CSG0, CSG1, CSG8, CSG9 is forcibly turned on in the burn-in test mode. Thus, it is possible, by writing data of an H level and data of an L level repeatedly, to impose large stress on transistors 183 and 184 constituting column select gates CSG0, CSG1, CSG8, CSG9. In addition, every bit line pair BLL0, ZBLL0, BLL1, ZBLL1, BLL8, ZBLL8, BLL9, ZBLL9, BLR0, ZBLR0, BLR1, ZBLR1, BLR8, ZBLR8, BLR9, ZBLR9 is disconnected from corresponding sense amplifier SA0, SA1, SA8, SA9 at this time. Accordingly, the current consumption required for charging and discharging these bit line pairs can be reduced.

Fourth Embodiment

Figure 12:
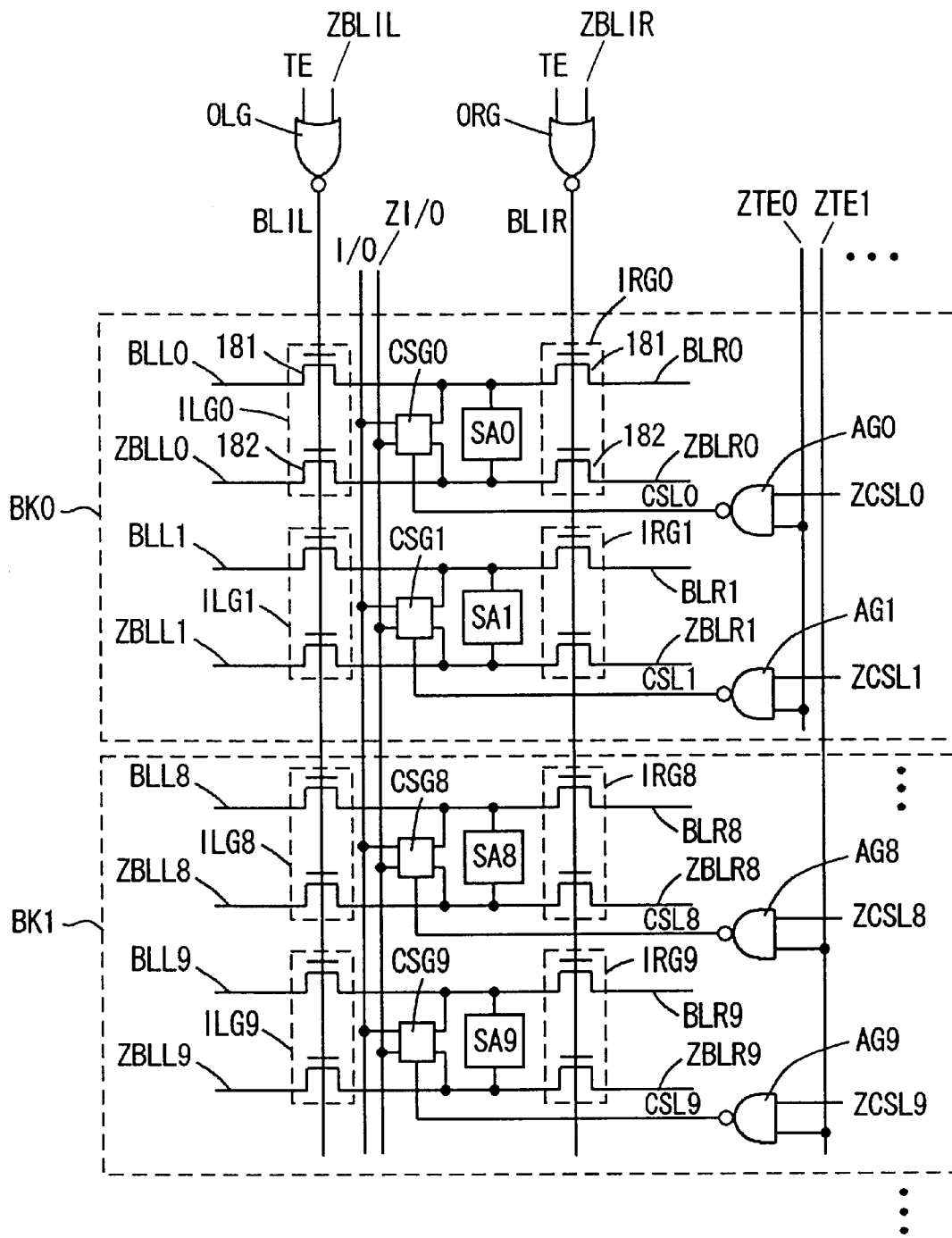
FIG. 12 is a block diagram showing a main configuration of the DRAM according to a fourth embodiment of the present invention.

FIG. 12 shows the main configuration of the DRAM according to the fourth embodiment. As shown in FIG. 12, the fourth embodiment differs from the third embodiment shown in FIG. 9 in that the bit line pairs, sense amplifiers, bit line isolating gates, column select gates and NAND circuits are divided into a plurality of blocks. In FIG. 12, two blocks BK0 and BK1 are shown representatively. Block BK0 includes bit line pairs BLL0, ZBLL0, BLL1, ZBLL1, BLR0, ZBLR0, BLR1, ZBLR1, sense amplifiers SA0, SA1, bit line isolating gates ILG0, ILG1, IRG0, IRG1, column select gates CSG0, CSG1, and NAND circuits AG0, AG1. Block BK1 includes bit line pairs BLL8, ZBLL8, BLL9, ZBLL9, BLR8, ZBLR8, BLR9, ZBLR9, sense amplifiers SA8, SA9, bit line isolating gates ILG8, ILG9, IRG8, IRG9, column select gates CSG8, CSG9, and NAND circuits AG8, AG9.

Here, the test signal is also divided into blocks. A test signal ZTE0 is provided to every NAND circuit AG0, AG1 within block BK0, and a test signal ZTE1 is provided to every NAND circuit AG8, AG9 within block BK1.

Figure 13:
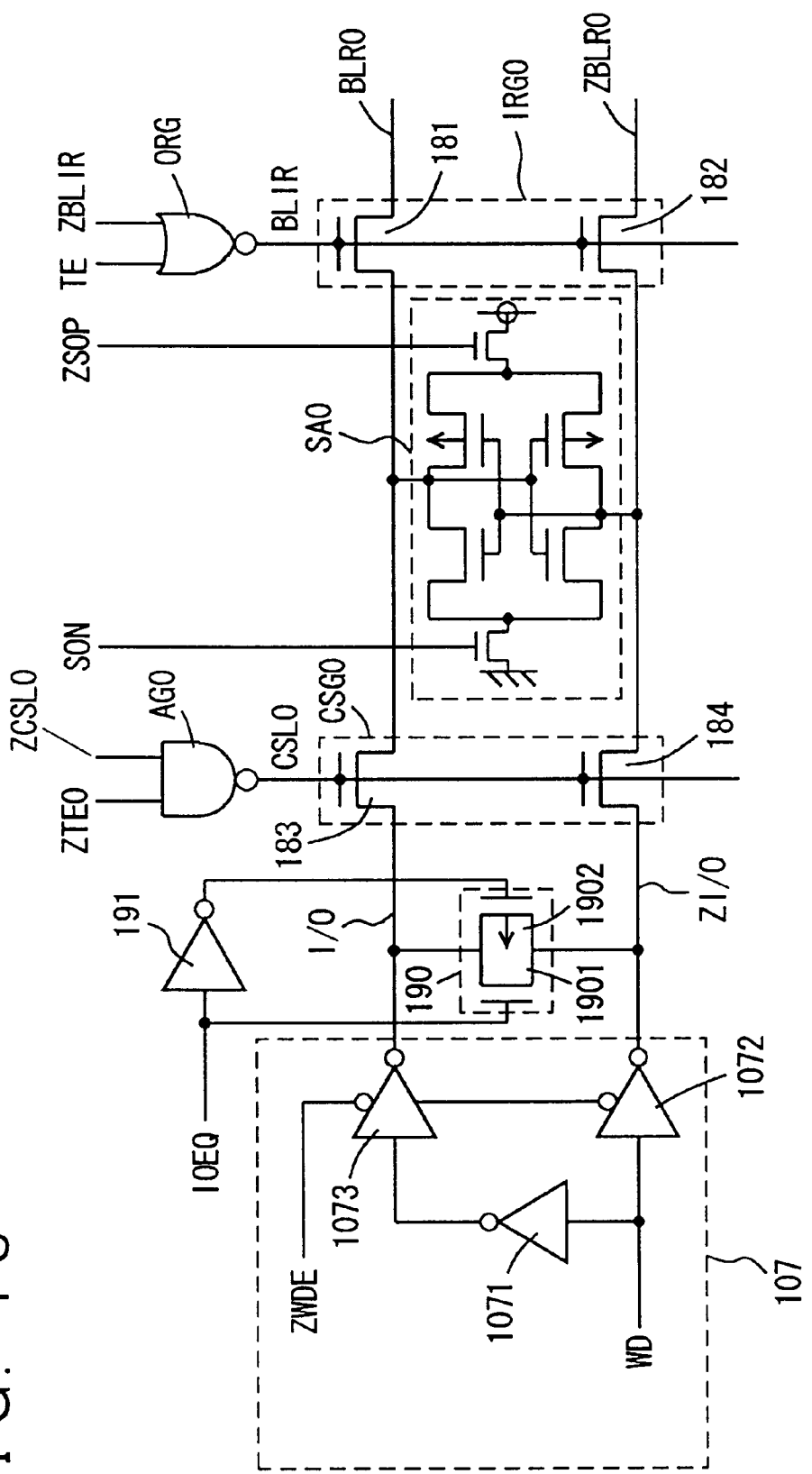
FIG. 13 is a circuit diagram showing configurations of the sense amplifier, the bit line isolating gate, and the column select gate in FIG. 12, and the write driver.

FIG. 13 shows configurations of sense amplifier SA0, bit line isolating gate IRG0, column select gate CSG0 in FIG. 12, and write driver 107 in FIG. 1. As shown in FIG. 13, the fourth embodiment differs from the third embodiment shown in FIG. 10 in that test signal ZTE0 activated on a block-by-block basis is provided to NAND circuit AG0.

Figure 14:
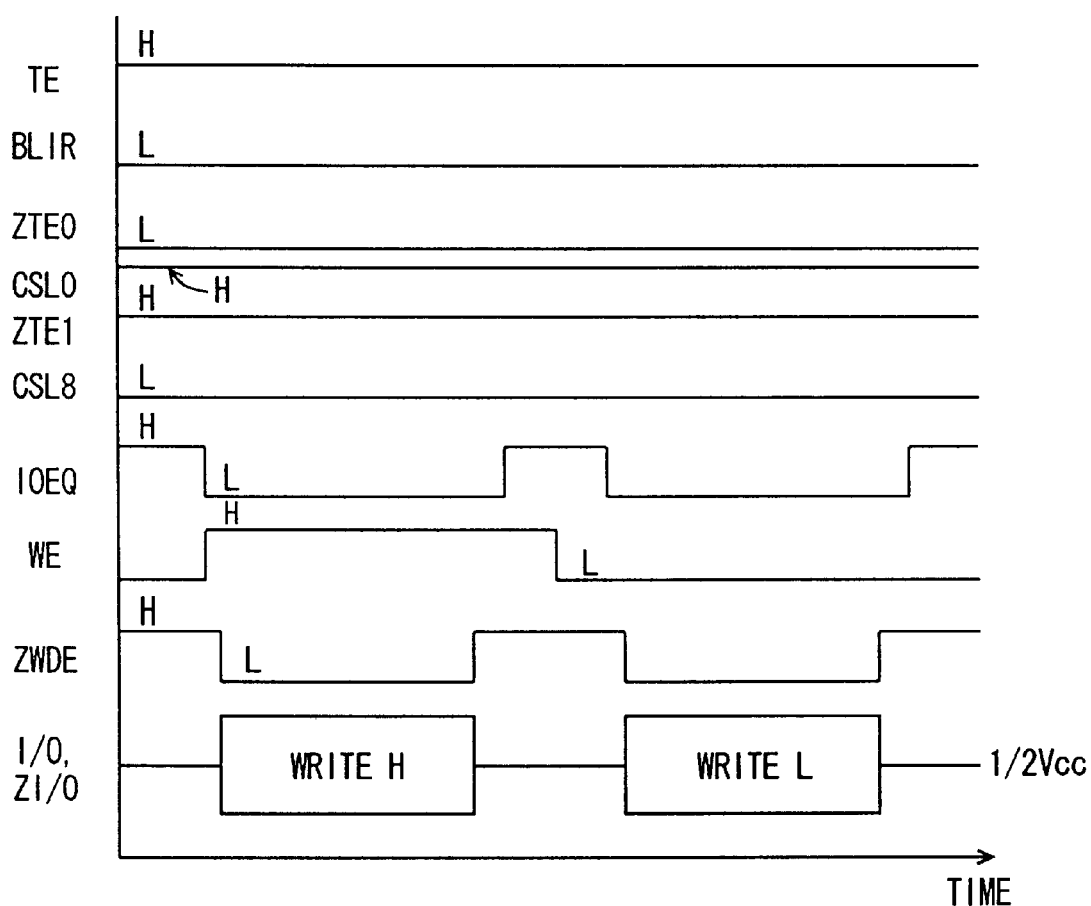
FIG. 14 is a timing chart illustrating an operation of the DRAM of the fourth embodiment shown in FIGS. 12 and 13 in the burn-in test mode.

When block BK0 is selected and block BK1 is non-selected, as shown in FIG. 14, test signal ZTE0 is at an L level and test signal ZTE 1 is at an H level. Thus, column select signals CSL0, CSL1 of selected block BK0 each attain an H level, while column select signals CSL8, CSL9 of non-selected block BK1 each attain an L level. Accordingly, every sense amplifier SA0, SA1 within selected block BK0 is connected to input/output line pair I/O, ZI/O, whereas every sense amplifier SA8, SA9 within non-selected block BK1 is not connected to input/output line pair I/O, ZI/O.

As described above, according to the fourth embodiment of the present invention, the column select gates only within a selected block are forcibly turned on, and thus, the sense amplifiers exclusively within the selected block are connected to input/output line pair I/O, ZI/O. The sense amplifiers in a non-selected block are not connected to input/output line pairs I/O, ZI/O. As a result, the current consumption during the burn-in test mode, and hence, the load on the burn-in tester can be reduced.

Fifth Embodiment

Figure 15:
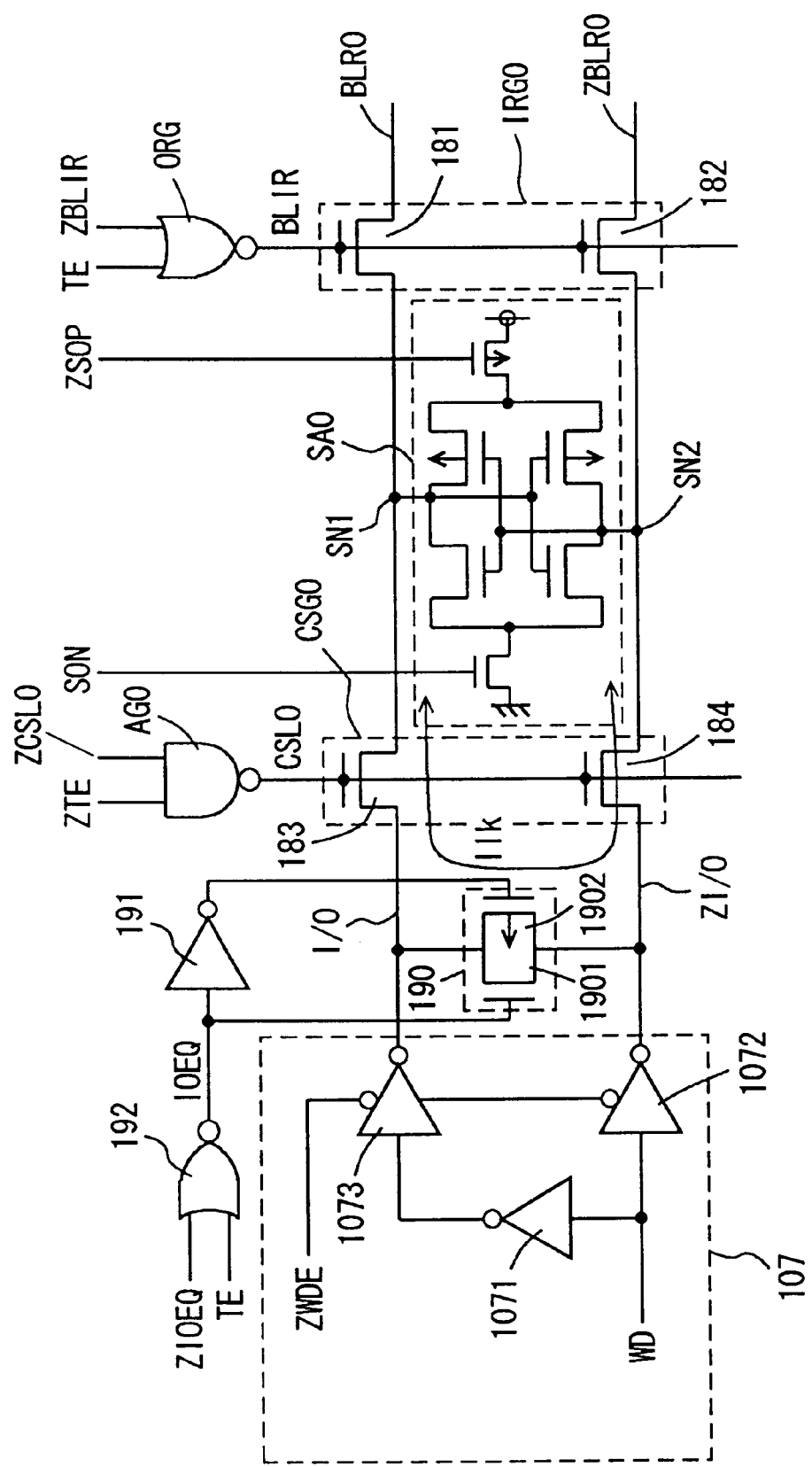
FIG. 15 is a circuit diagram showing a main configuration of the DRAM according to a fifth embodiment of the present invention.

FIG. 15 shows the main configuration of the DRAM according to the fifth embodiment. Referring to FIG. 15, sense amplifier SA0 is activated in response to sense amplifier driving signals S0N and ZS0P, and amplifies a potential difference having occurred between bit line pair BLR0, ZBLR0. The fifth embodiment differs from the third embodiment shown in FIG. 10 in that a NOR circuit 192 is provided which generates equalizing signal IOEQ in response to equalizing signal ZIOEQ and test signal TE.

In the normal reading and writing modes, test signal TE is inactivated to an L level, so that equalizing circuit 190 operates normally in response to equalizing signal ZIOEQ.

Figure 16:
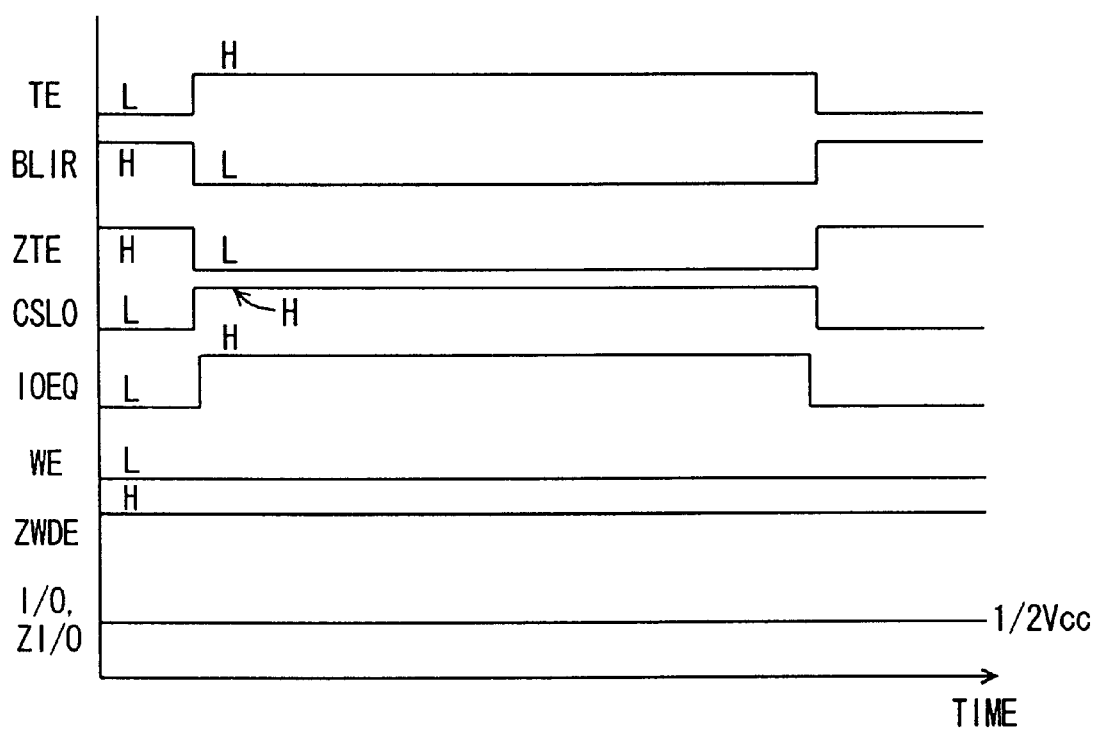
FIG. 16 is a timing chart illustrating an operation of the DRAM of the fifth embodiment shown in FIG. 15 in the burn-in test mode.

In the burn-in test mode, as shown in the timing chart of FIG. 16, equalizing signal IOEQ attains an H level during the time period in which the sense amplifier is connected to input/output line pair I/O, ZI/O and activated. When equalizing signal IOEQ attains an H level, equalizing circuit 190 turns on, and leakage current Ilk flows between one sense node SN1 and another sense node SN2 of sense amplifier SA0 via transistors 183, 184 and equalizing circuit 190.

As explained above, according to the fifth embodiment of the present invention, equalizing circuit 190 is turned on in the burn-in test mode while the sense amplifier is being connected to input/output line pair I/O, ZI/O. Accordingly, it is possible to impose large stress on transistors 183, 184 constituting the column select gate, and thus, to reduce the load applied to the burn-in tester.

Sixth Embodiment

Figure 17:
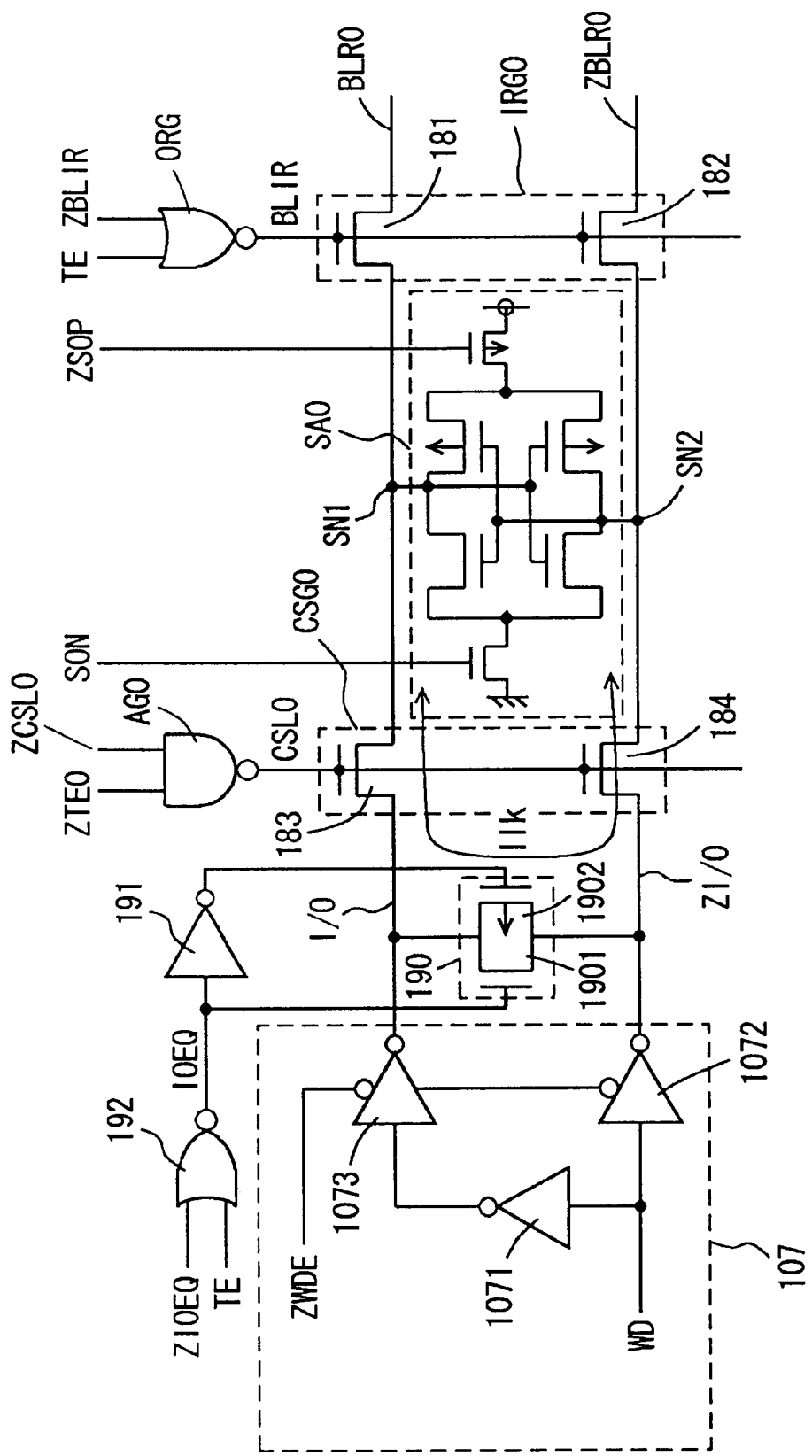
FIG. 17 is a circuit diagram showing a main configuration of the DRAM according to a sixth embodiment of the present invention.
Figure 18:
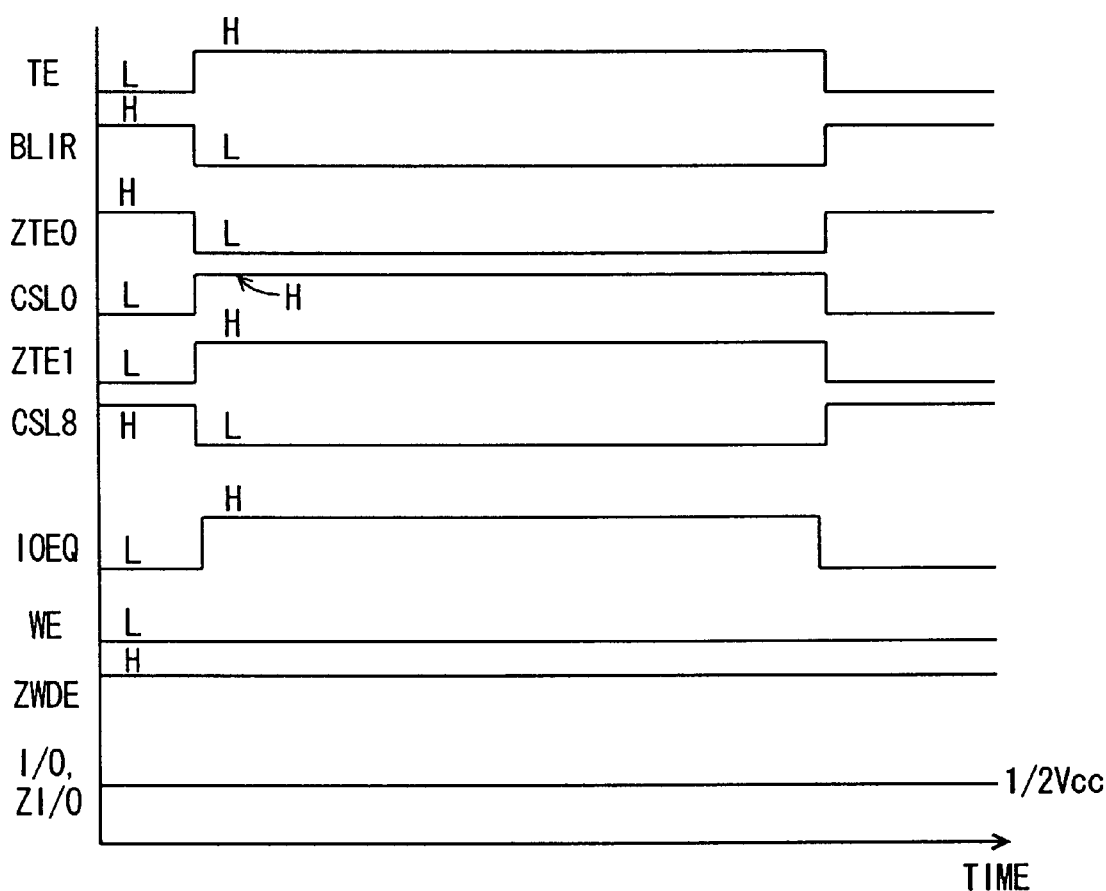
FIG. 18 is a timing chart illustrating an operation of the DRAM of the sixth embodiment shown in FIG. 17 in the burn-in test mode.
Figure 19:
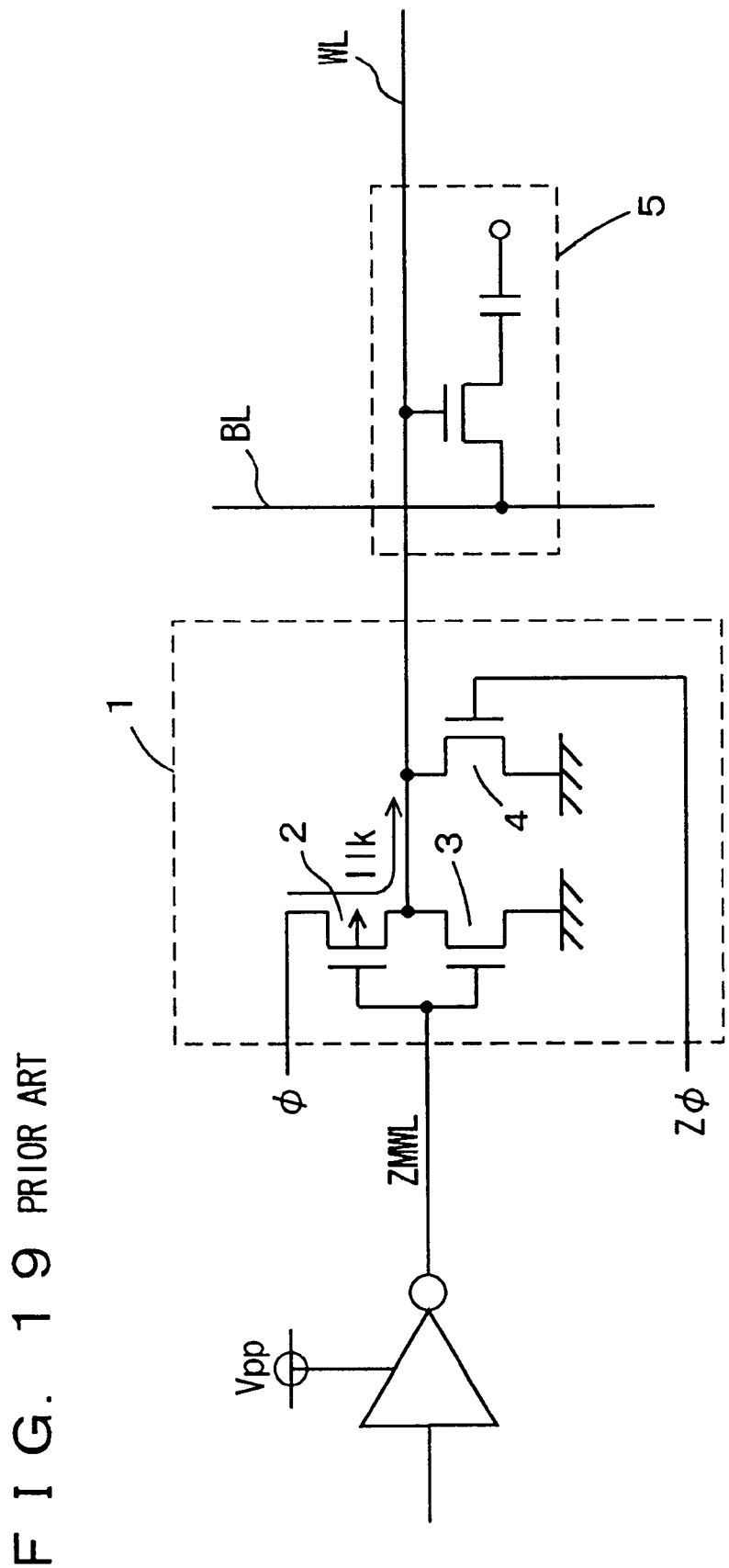
FIG. 19 is a circuit diagram showing the configurations of the word line driver and its peripheral according to the conventional DRAM.
Figure 20A:
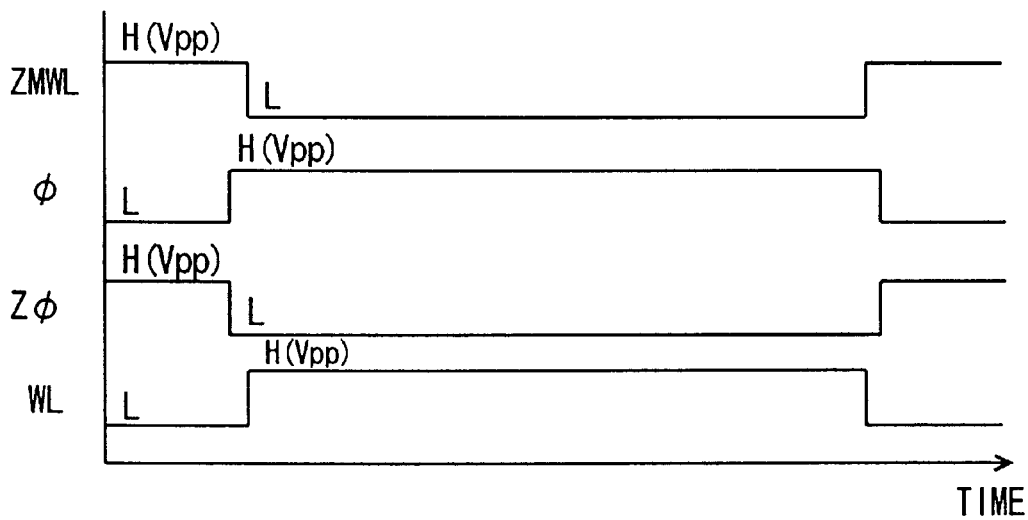
FIG. 20A is a timing chart illustrating the operation of the word line driver shown in FIG. 19 when the word line is selected.
Figure 20B:
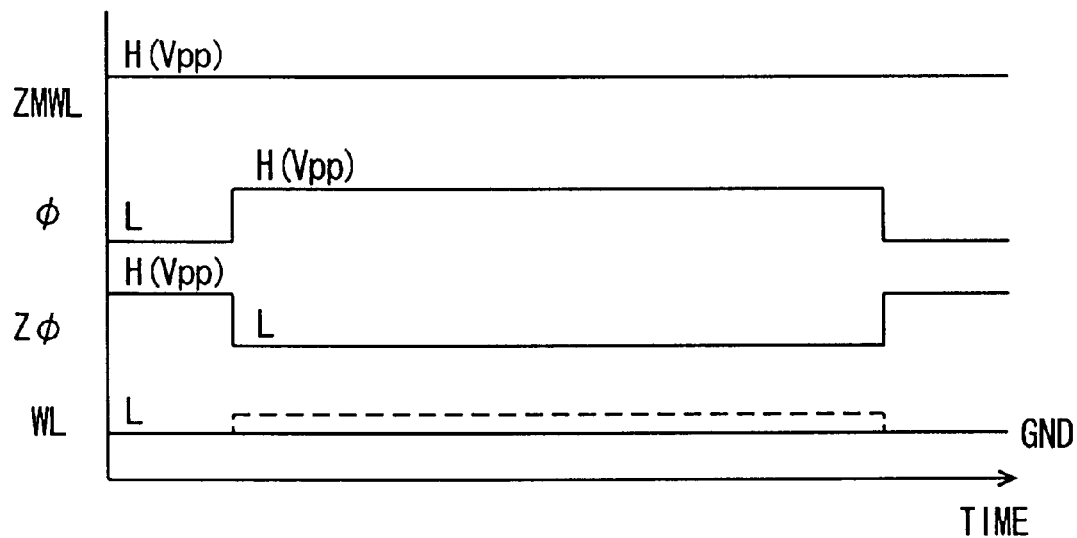
FIG. 20B is a timing chart when the word line is non-selected.
Figure 21:
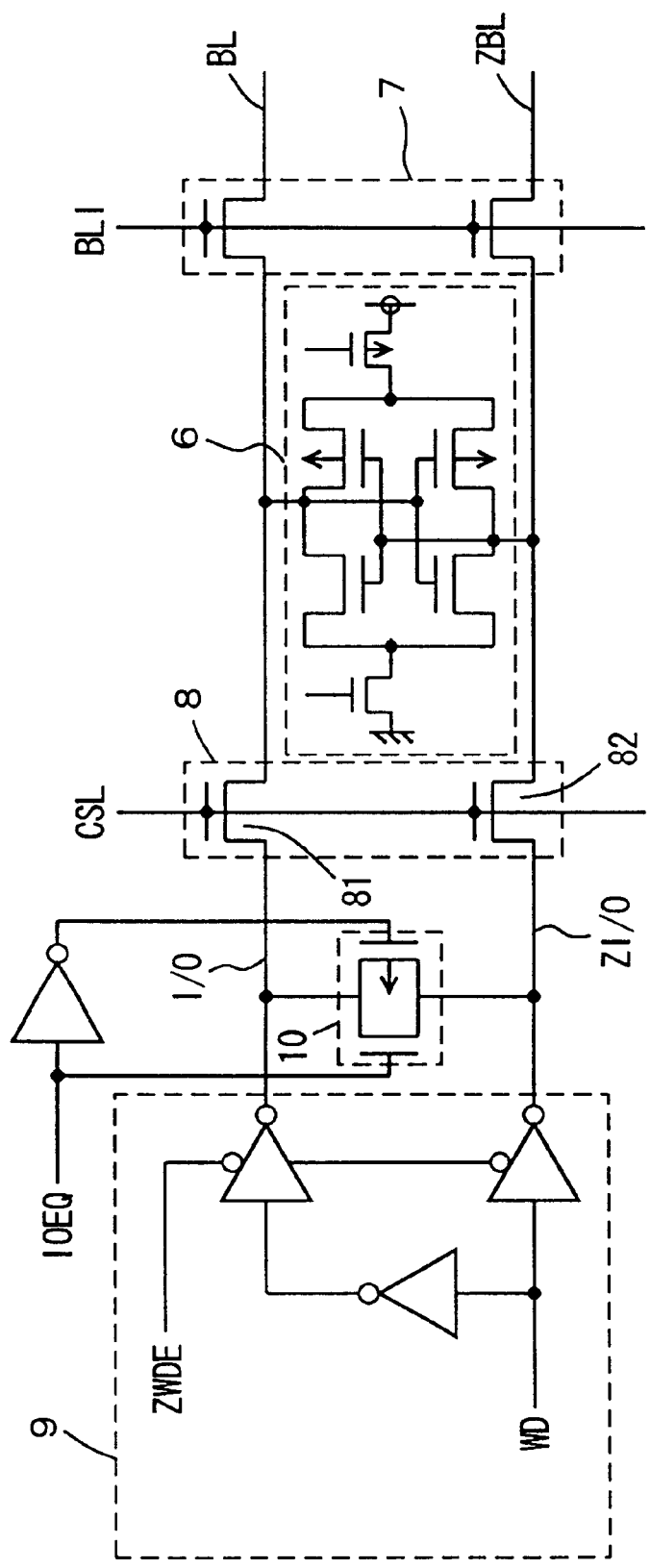
FIG. 21 is a circuit diagram showing the configurations of the sense amplifier and its peripheral of the conventional DRAM.
Figure 22:
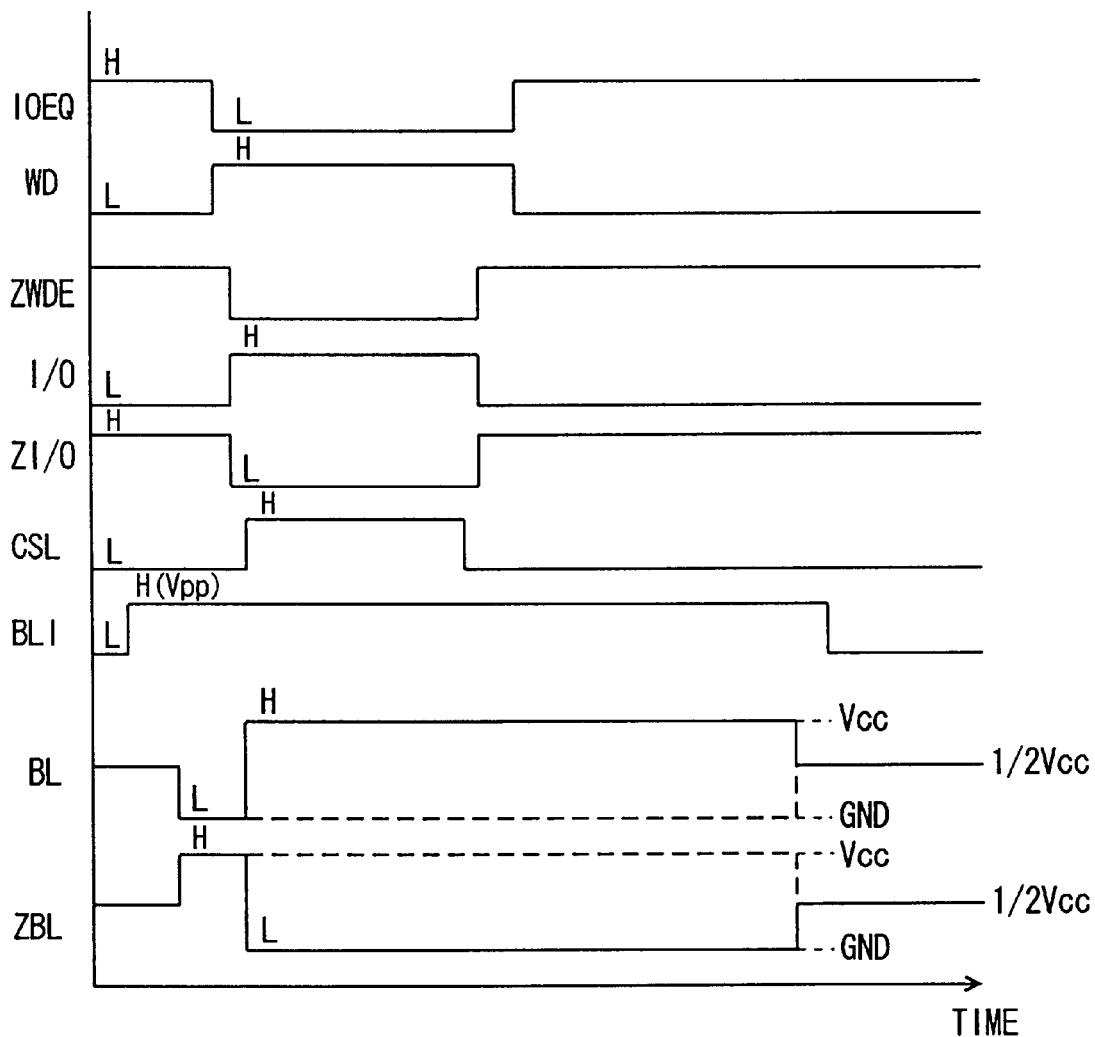
FIG. 22 is a timing chart illustrating the writing operation of the DRAM shown in FIG. 21.

FIG. 17 shows the main configuration of the DRAM according to the sixth embodiment. FIG. 18 is a timing chart illustrating the operation of the DRAM shown in FIG. 17 in the burn-in test mode.

The sixth embodiment differs from the fifth embodiment in that the bit line pairs, sense amplifiers, bit line isolating gates and column select gates are divided into a plurality of blocks, as in the fourth embodiment shown in FIG. 12. The sixth embodiment shown in FIGS. 17 and 18, however, differs from the fourth embodiment shown in FIGS. 13 and 14 in that equalizing signal IOEQ attains an H level during the time period in which the sense amplifier is connected to input/output line pair I/O, ZI/O and activated, as in the fifth embodiment shown in FIGS. 15 and 16.

In a selected block, test signal ZTE0 is at an L level. Thus, column select signal CSL0 attains an H level, and the sense amplifier is connected to input/output line pair I/O, ZI/O. In contrast, in a non-selected block, test signal ZTE1 is at an H level. Thus, column select signal CSL8 attains an L level, and the sense amplifier is not connected to input/output line pair I/O, ZI/O. As such, while leakage current Ilk flows between one sense node SN1 and another sense node SN2 of the sense amplifier via transistors 183, 184 constituting the column select gate and equalizing circuit 190 in the selected block, such a leakage current does not flow in the non-selected block. As a result, it is possible to reduce the current consumption during the burn-in test mode, and hence, the load on the burn-in tester.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a word line;

a word line driver driving said word line;

a word line select circuit generating a word line select signal for selecting said word line, said word line driver including a first transistor having one conductive electrode receiving a boosted potential higher than a power supply potential, another conductive electrode connected to said word line, and a control electrode receiving said word line select signal, and a second transistor having one conductive electrode grounded, another conductive electrode connected to said word line, and a control electrode receiving said word line select signal; and a turn-on circuit turning on said first transistor in response to a test signal.

2. The semiconductor memory device according to claim 1, wherein said turn-on circuit responds to said test signal and drives said word line select signal to a potential lower than said boosted potential.

3. The semiconductor memory device according to claim 2, wherein said turn-on circuit provides a power supply of said word line select circuit with a potential lower than said boosted potential when said test signal is in an active state, and with said boosted potential when said test signal is in an inactive state, and said word line select circuit drives said word line select signal to a ground potential when said word line is selected, and to a potential provided to the power supply of said word line select circuit when said word line is non-selected.

* * * * *